(12) United States Patent
Obata

(10) Patent No.: US 10,326,053 B2
(45) Date of Patent: Jun. 18, 2019

(54) NITRIDE SEMICONDUCTOR LIGHT EMITTING ELEMENT

(71) Applicant: Stanley Electric Co., Ltd., Tokyo (JP)

(72) Inventor: Toshiyuki Obata, Yamaguchi (JP)

(73) Assignee: Stanley Electric Co., Ltd., Tokyo (JP)

(*) Notice: Subject to any disclaimer, the term of this patent is extended or adjusted under 35 U.S.C. 154(b) by 0 days.

(21) Appl. No.: 15/745,200

(22) PCT Filed: Jul. 11, 2016

(86) PCT No.: PCT/JP2016/070451
§ 371 (c)(1),
(2) Date: Jan. 16, 2018

(87) PCT Pub. No.: WO2017/014094
PCT Pub. Date: Jan. 26, 2017

(65) Prior Publication Data
US 2018/0358511 A1    Dec. 13, 2018

(30) Foreign Application Priority Data
Jul. 17, 2015 (JP) .................................. 2015-143411

(51) Int. Cl.
*H01L 33/32*  (2010.01)
*H01L 33/38*  (2010.01)
*H01L 33/40*  (2010.01)
*H01L 33/36*  (2010.01)

(52) U.S. Cl.
CPC .............. *H01L 33/32* (2013.01); *H01L 33/36* (2013.01); *H01L 33/38* (2013.01); *H01L 33/40* (2013.01)

(58) Field of Classification Search
CPC combination set(s) only.
See application file for complete search history.

(56) References Cited

U.S. PATENT DOCUMENTS

| | | | |
|---|---|---|---|
| 7,709,845 B2 | 5/2010 | Ko et al. | |
| 9,349,991 B2 | 5/2016 | Lau et al. | |
| 2006/0043388 A1* | 3/2006 | Kwak | H01L 33/405 257/80 |

(Continued)

FOREIGN PATENT DOCUMENTS

| | | |
|---|---|---|
| JP | 200674042 A | 3/2006 |
| JP | 2007134700 A | 5/2007 |

(Continued)

OTHER PUBLICATIONS

International Search Report, PCT/JP2016/070451, dated Aug. 16, 2016.

(Continued)

*Primary Examiner* — Fernando L Toledo
*Assistant Examiner* — Valerie N Newton
(74) *Attorney, Agent, or Firm* — Cahn & Samuels, LLP

(57) ABSTRACT

A group III nitride semiconductor element includes an active layer between an n-type layer and a p-type layer and has a mesa structure containing the p-type layer, and includes an n electrode on the n-type layer and a p electrode on the p-type layer. The p electrode is obtained by sequentially laminating a first metal layer, a conductive layer and a second metal layer in this order. The resistivity of the conductive layer is higher than the resistivity of the first metal layer.

9 Claims, 14 Drawing Sheets

(56) References Cited

U.S. PATENT DOCUMENTS

| | | |
|---|---|---|
| 2007/0102715 A1 | 5/2007 | Ko et al. |
| 2015/0048304 A1* | 2/2015 | Niwa ............... H01L 33/32 |
| | | 257/13 |
| 2018/0033913 A1 | 2/2018 | Furuya et al. |
| 2018/0040770 A1 | 2/2018 | Obata et al. |

FOREIGN PATENT DOCUMENTS

| | | |
|---|---|---|
| JP | 2010171142 A | 8/2010 |
| JP | 201330817 A | 2/2013 |
| JP | 2014096460 A | 5/2014 |
| JP | 2014096539 A | 5/2014 |
| JP | 2014183090 A | 9/2014 |
| WO | 2011071559 A1 | 6/2011 |
| WO | 2017150280 A1 | 9/2017 |
| WO | 2017169364 A1 | 10/2017 |

OTHER PUBLICATIONS

English Abstract of JP 2014183090, Sep. 29, 2014.
English Abstract JP 201330817, Feb. 7, 2013.
English Abstract of JP 200674042, Mar. 16, 2006.
English Abstract of JP 2010171142, Aug. 5, 2010.
Interational Preliminary Report on Patentability, PCT/JP2016/070451, dated Feb. 1, 2018.
English Abstract of JP 2014096539, May 22, 2014.
English Abstract of JP 2014096460, May 22, 2014.
English Abstract of JP 2007134700, May 31, 2007.
English Abstract of WO2017169364 A1, Oct. 5, 2017.
English Abstract of WO 2011071559 A1, Jun. 16, 2011.
English Abstract of WO 2017150280, Sep. 8, 2017.

* cited by examiner

NITRIDE SEMICONDUCTOR LIGHT EMITTING ELEMENT

This application is a U.S. national stage application of PCT/JP2016/070451 filed on 11 Jul. 2016 and claims priority to Japanese patent document 2015-143411 filed on 17 Jul. 2015, the entireties of which are incorporated herein by reference.

TECHNICAL FIELD

The present invention relates to a group III nitride semiconductor luminescence element having a luminescence peak wavelength of ultraviolet ray. Particularly, the present invention relates to an art of suppressing the decrease of a luminescence efficiency of the element caused by the current concentration to an edge part of a mesa structure of the luminescence element. Also, the present invention relates to a wafer including the constitution of said luminescence element.

BACKGROUND OF THE INVENTION

FIG. 8A and FIG. 8B show typical schematic structures of a group III nitride semiconductor luminescence element 41. FIG. 8A is a top view of the element, and FIG. 8B shows the cross section at A-A line of FIG. 8A. The group III nitride semiconductor luminescence element 41 is formed with a laminate (hereinafter, this may be referred as a "laminate semiconductor layer") having a n-type layer 12, an active layer 13, and a p-type layer 14 on one surface side of a substrate 11; and having a mesa structure 15 at a part of the laminate semiconductor layer thereof is known. The mesa structure 15 is formed by forming the laminate semiconductor layer including the n-type layer 12, the active layer 13, and the p-type layer 14 on one surface side of the substrate 11, and then removing a part of the laminate structure by etching or so to expose a part of the n-type layer 12. A part having a plateau shape (also called as a mesa) including the active layer 13 and the p-type layer 14 is maintained; thereby the mesa structure 15 is formed (see the patent document 1). An n-electrode 16 is formed on the exposed surface of the n-type layer 12, and a p-electrode 17 is formed at the surface of the p-type layer 14.

For the group III nitride semiconductor luminescence element 41 having the mesa structure 15, when the driving voltage is applied to the p-electrode 17 on the p-type layer and the n-electrode 16 on the n-type layer, the current flows through the pathway having a low resistance (usually the shortest pathway) between the p-electrode and the n-electrode, thus the current runs by concentrating near the edge part of the mesa structure 15 (hereinafter, it may be called as a "mesa edge") close to the n-electrode and the p-electrode. As a result, the current does not flow uniformly to the active layer 13, thus uneven luminescence occurs and causes the luminescence efficiency to decrease.

The patent document 2 discloses the ultraviolet semiconductor luminescence element wherein the high resistance layer having higher resistance than the p-type layer or p-electrode is formed on the surface of the p-type layer in a shape along the shape of p-type layer side at a side closer to the n-electrode. As disclosed in the patent document 2, when the high resistance layer is formed on the p-type layer close to the mesa edge, the current can be suppressed from concentrating near the mesa edge.

The patent document 3 discloses the semiconductor luminescence element wherein a trench is formed between the p-electrode and the n-electrode. By forming the trench, the length of the current pathway running between the p-electrode and the n-electrode is suppressed from varying; thereby the current is suppressed from concentrating to a particular part. However, in order to make the varying of the length of the current pathway sufficiently small, the depth of the trench must be deep.

Due to various designs of the recent devices, the luminescence element having various shapes and constitutions has been proposed, and also there are variety of mesa structures and designs of the electrode shapes. Thus, the art of forming the high resistance layer and trench as mentioned in the above will increase the steps for producing the luminescence element, and the production will be complicated, hence it has become difficult to correspond to the various mesa structures and electrode shapes in a timely manner.

Further particularly, the deep ultraviolet ray luminescence element having the luminescence peak wavelength of 200 to 350 nm has increased specific resistance of the n-type layer because Al composition is high in the n-type layer, thus the current tends to concentrate near the mesa edge, which tends to decrease the luminescence efficiency. Thus, the development of the luminescence element capable of suppressing the decrease of the luminescence efficiency which is caused by the current concentration is in demand.

REFERENCES

Patent Document

Patent document 1: JP Patent Application Laid Open No. 2014-96539
Patent document 2: JP Patent Application Laid Open No. 2014-96460
Patent document 3: JP Patent Application Laid Open No. 2007-134700

DISCLOSURE OF INVENTION

Problem to be Solved by the Invention

The object of the present invention is to provide the technology capable of suppressing the decrease of the luminescence efficiency by suppressing the current flowing between the p-electrode and the n-electrode from concentrating near the mesa edge of the semiconductor having a mesa structure.

The present inventor speculated that the above object can be attained by regulating the structure of the p-electrode, and has carried out keen examination. The present inventor has found that the above mentioned object can be attained by the group III nitride semiconductor having a p-electrode laminated with a first metal layer, a conductive layer and a second metal layer in this order (hereinafter, it may be referred as "p-type electrode structure 30"), and having a specific resistance of said conductive layer higher than the specific resistance of said first metal layer, thereby the present invention was attained.

That is, the first invention is the group III nitride semiconductor element having a mesa structure comprising a n-type layer, a p-type layer, an active layer provided between the n-type layer and the p-type layer, wherein a n-electrode is provided on said n-type layer, a p-electrode is laminated with a first metal layer, a conductive layer and a second metal layer in this order on said p-type layer, and a specific resistance of said conductive layer is higher than the specific resistance of said first metal layer.

The second invention is the group III nitride semiconductor element as set forth in the first invention wherein a thickness of said conductive layer is 0.05 μm or more and 20 μm or less, and the specific resistance of the conductive layer is $0.1 \times 10^{-4}$ to $1.0 \times 10^{-2}$ Ωcm.

The third invention is the group III nitride semiconductor element as set forth in the first or second invention, wherein said first metal layer is a layer ohmically contacting with said p-type layer, and said first metal layer is constituted from single metal or two or more metals.

The fourth invention is the group III nitride semiconductor element as set forth in any one of the first to third inventions, wherein from the top view of said group III nitride semiconductor luminescence element, a distance between an edge of the mesa structure and the outer peripheral of said second metal layer is ⅓ or more of the scattering length $L_s$.

The fifth invention is the group III nitride semiconductor element as set forth in any one of the first to third inventions, wherein from the top view of said group III nitride semiconductor luminescence element, a distance between at least a projection part of the edge of the mesa structure and the outer peripheral of said second metal layer is ⅓ or more of the scattering length $L_s$.

The sixth invention is the group III nitride semiconductor element as set forth in any one of the first to third inventions, wherein from the top view of said group III nitride semiconductor luminescence element, a distance between an edge of the mesa structure and the outer peripheral of said second metal layer is 20 μm or more.

The seventh invention is the group III nitride semiconductor element as set forth in any one of the first to third inventions, wherein from the top view of said group III nitride semiconductor luminescence element, a distance between at least a projection part of the edge of the mesa structure and the outer peripheral of said second metal layer is 20 μm or more.

The eighth invention is the group III nitride semiconductor luminescence element as set forth in any one of the first to seventh inventions, a luminescence peak wavelength is 200 to 350 nm. Usually, the group III nitride semiconductor luminescence element having the luminescence peak wavelength of 200 to 350 nm has the n-type layer with increased specific resistance because the n-type layer has high Al composition, thus the electric current tends to concentrate to the mesa edge and tends to cause the decrease of the luminescence efficiency. However, the constitution of the present invention does not have such problem thus it is suitable.

The ninth invention is a wafer comprising a constitution of a group III nitride semiconductor element having a mesa structure comprising a n-type layer, a p-type layer, and an active layer provided between the n-type layer and the p-type layer wherein the constitution of said group III nitride semiconductor element is as set forth in any one of the first to seventh inventions.

The tenth invention is a wafer comprising a constitution of a group III nitride semiconductor luminescence element having a mesa structure comprising a n-type layer, a p-type layer, and an active layer provided between the n-type layer and the p-type layer wherein the constitution of said group III nitride semiconductor luminescence element is as set forth in the eighth invention.

In the present invention, the group III nitride semiconductor element has a p-electrode laminated with a first metal layer, a conductive layer and a second metal layer in this order on the p-type layer, and said conductive layer has the higher specific resistance than the specific resistance of said first metal layer, thereby the current flowing between the p-electrode and the n-electrode is suppressed from concentrating near the area of the mesa edge. As a result, the current easily flow uniformly to the active layer, and the uneven luminescence is suppressed, thereby the group III nitride semiconductor element suppressed with the decrease of the luminescence efficiency can be obtained.

Also, in the present invention, said first metal layer and said conductive layer are formed to the entire laminate face of the mesa part in the p-type electrode structure 30 constituting the p-electrode, and when forming the second metal layer, from the top view of said group III nitride semiconductor luminescence element, a distance between the mesa edge and the outer peripheral of said second metal layer can be a predetermined distance or more. By making the distance between the mesa edge and the outer peripheral of said second metal layer to a predetermined distance or more, the current flowing between the p-electrode and the n-electrode can be further suppressed from concentrating near the area of the mesa edge, and the decrease of the luminescence efficiency can be suppressed.

Also, in the present invention, for all the mesa edges, the distance between the mesa edge and the outer peripheral of the second metal layer can be a predetermined distance or more. By making the distance between the mesa edge and the outer peripheral of said second metal layer to a predetermined distance or more for all of the mesa edges, the current concentration can be suppressed even more.

Further, in the present invention, the distance between a part of the mesa edge and the outer peripheral of said second metal layer can be a predetermined distance or more. If the distance between the edge of the mesa structure and the outer peripheral of said second metal layer is a predetermined length or more for all of the mesa edge, the area of the second metal layer becomes small, and the resistance value of the current flowing between the p-electrode and the n-electrode becomes large, and the driving voltage may become large. By making the distance between a part of the mesa edge and the outer peripheral of said second metal layer to a predetermined distance or more, the second metal layer can be formed wider, and the resistance value of the current flowing between the p-electrode and the n-electrode can be suppressed from increasing, thus the driving voltage can be suppressed from increasing.

From the point of further suppressing the driving voltage from increasing, in the present invention, the distance between at least the projection part of the mesa edge and the outer peripheral of said second metal layer can be a predetermined distance or more. By making distance between at least the projection part of the mesa edge and the outer peripheral of said second metal layer to a predetermined distance or more, the increase of the driving voltage is suppressed, and the current flowing between the p-electrode and the n-electrode can be suppressed from concentrating near the mesa edge. As a result, the decrease of the luminescence efficiency can be suppressed, and the damage to the quality can be reduced.

Particularly, the specific resistance increases for the ultraviolet ray emitting element having the luminescence peak wavelength of 200 to 350 nm, compared to the luminescence element having the luminescence peak wavelength of more than 350 nm such as the luminescence element having the visible light range, because the n-type layer has higher Al composition, thus the current tends to concentrate near the mesa edge, and the decrease of the luminescence efficiency tends to easily occur. Therefore, the constitution of the present invention is suited as the constitution of the ultraviolet ray emitting element having the luminescence peak wavelength of 200 to 350 nm.

DETAILED DESCRIPTION OF INVENTION

Hereinafter, the embodiment of the present invention will be explained by referring to the figures. Note that, the semiconductor element described in below is one example realizing the concept of the present invention, but the present invention is not limited thereto. For example, the size, the material, the shape and the relative position or so of the element described in below are merely an example used for describing, and the present invention is not to be limited thereto, unless mentioned otherwise. Note that, the size and the relationship of the position of the members shown in each figure may be exaggerated in order to make the description clear.

The luminescence range of the light emitted from the group III nitride semiconductor luminescence element of the present invention is not particularly limited. According to the present invention, regardless of the luminescence range, the decrease of the luminescence efficiency due to the local current concentration to the mesa structure can be suppressed. Preferably, the present invention is used for the group III nitride semiconductor luminescence element having the luminescence peak wavelength in the visible light range or in the ultraviolet range. More preferably, the present invention is used for the group III nitride semiconductor luminescence element emitting the ultraviolet ray having the luminescence peak wavelength of 200 to 350 nm. Hereinafter, the group III nitride semiconductor luminescence element having the luminescence peak wavelength of 200 to 350 nm will be mainly discussed.

Figure 1:
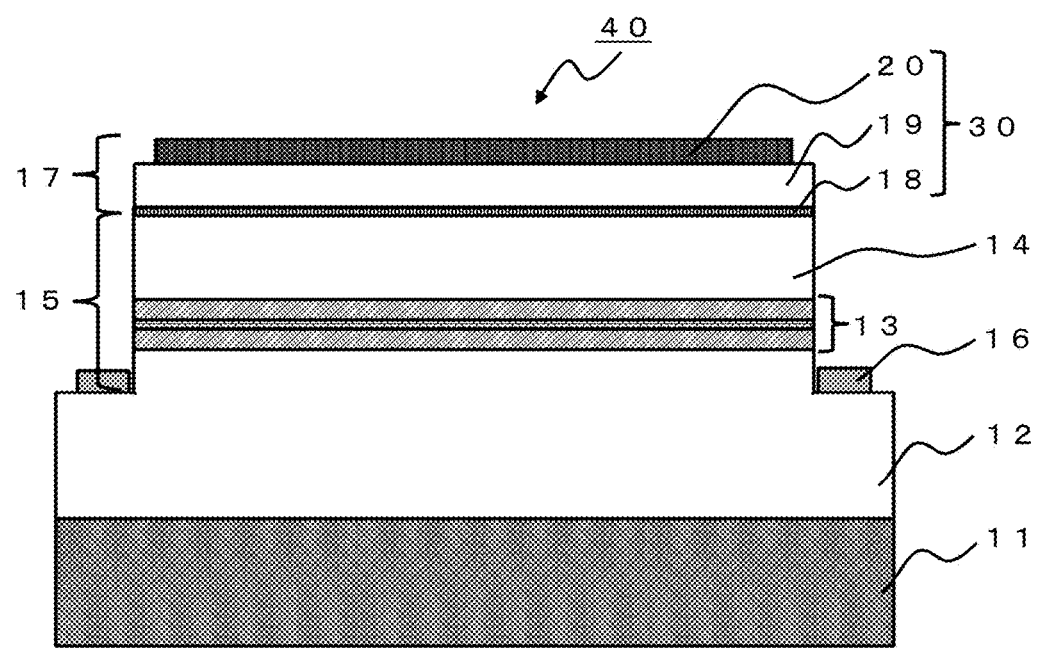
FIG. 1 is a cross section of the group III nitride semiconductor element of the present invention.

As shown in FIG. 1, the group III nitride semiconductor element 40 of the present invention has a substrate 11, an n-electrode 16, a p-electrode 17, and a mesa structure 15 (a laminate semiconductor layer) including the n-type layer 12, the active layer 13 and the p-type layer 14. The p-type electrode structure 30 constituting the p-electrode 17 has a first metal layer 18, a conductive layer 19 and a second metal layer 20. Hereinafter a non-limiting example thereof will be described.

Note that, "mesa edge" refers to the outline of the mesa structure 15 and it is the end part of the mesa structure viewing from the top, which is also shown as the outer peripheral of the p-type layer 14 (that is the outline). The mesa structure is formed by perpendicularly etching the laminate semiconductor layer, but it does not have to be perfectly perpendicular, and it may be formed in a taper form from the upper part to the lower part of the mesa structure. If the area of the upper part of the mesa structure is smaller than the area of the lower part of the mesa structure, the taper part can be observed by viewing from the top. If the area of the upper part of the mesa structure is larger than the area of the lower part of the mesa structure, the taper part will be formed in an overhang form, hence it will be difficult to observe from the top.

In the below description, the mesa edge is the edge part of the mesa structure 15 from the top view, also defined as the outer peripheral (outline) of the p-type layer 14 positioned at the upper most layer of the mesa structure, and it does not include the taper part.

Also, a refraction factor, a transmission factor, and a reflection factor are based on the light having the wavelength of 265 nm. This is because DNA has a maximum absorbance near the wavelength of 265 nm, thus the light having the wavelength of 265 nm is most suited for sterilization, and hence will have high industrial applicability. Hereinafter, when simply referring to the refraction factor, the transmission factor, and the reflection factor, these are values with respect to the light having the wavelength of 265 nm.

<Substrate>

The substrate 11 allows the epitaxial growth of the group III nitride semiconductor crystal on the surface, and as long as it is a substrate allowing the ultraviolet ray to transmit through, it is not particularly limited. As the material used for the substrate 11, for example, sapphire, SiC (silicon carbide), AlN (aluminum nitride), Si (silicon) or so may be mentioned. Among these, an AlN single crystal substrate using c-plane as a principle plane is preferable.

The higher the transmission factor of the substrate 11 with respect to the light having the wavelength of 265 nm is, the better it is; and preferably it is 50% or more, and more preferably 60% or more. The upper limit of the transmission factor of the substrate 11 is preferably 100%; but from the point of the industrial production, the upper limit is 80%.

The transmission factor of the substrate can be regulated by the material, the thickness, the crystallinity and the impurity content of the substrate.

The thickness of the substrate 11 is not particularly limited, but preferably it is 30 to 1500 μm, and more preferably 50 to 1000 μm. By setting the thickness of the substrate 11 within the above mentioned range, the transmission factor is improved, and the productivity is improved. The thickness of the substrate 11 only needs to satisfy the above mentioned range after the group III nitride semiconductor element is produced; and the lower face of the substrate may be ground or polished after laminating the laminate semiconductor layer and the electrode on the substrate, thereby the thickness of the substrate may be within the above mentioned range.

<Laminate Semiconductor Layer>

The laminate semiconductor layer (the main part of the element including the mesa structure 15 of FIG. 1) is formed on the substrate 11 as shown in FIG. 1, and the n-type layer 12, the active layer 13 and the p-type layer 14 (the layer formed of a p-type clad layer and a p-type contact layer) are stacked in this order. Each layer will be described in below as a non-limiting example.

<N-Type Layer>

The n-type layer 12 is a group III nitride semiconductor constituted by $Al_xIn_yGa_zN$ (x, y, and z are rational numbers satisfying $0<x\leq1.0$, $0\leq y\leq0.1$, $0\leq z<1.0$, and $x+y+z=1.0$), and preferably it includes impurity.

The impurity is not particularly limited, but preferably Si, Ge, Sn or so may be mentioned. Among these, Si and Ge are preferable. The concentration of the impurity is $1.0\times10^{17}$ $cm^{-3}$ or more and $5.0\times10^{20}$ $cm^{-3}$ or less; and preferably $1.0\times10^{18}$ $cm^{-3}$ or more and $5.0\times10^{19}$ $cm^{-3}$ or less. By setting the concentration of the impurity within the above range, the crystallinity and the contact characteristic of the n-type layer improves. Such n-type layer may be produced by MOCVD method.

The refraction factor of the n-type layer is not particularly limited, but it is 1.5 to 3.0. The refraction factor may be regulated by the composition of the n-type layer.

The thickness of the n-type layer is 100 nm or more and 10000 nm or less, and preferably 500 nm or more and 3000 nm or less. By having the thickness of the n-type layer within the above range, the crystallinity and the conductivity of the n-type layer improves.

Note that, although it is not shown in FIG. 1, the group III nitride semiconductor element 40 may comprise a buffer layer including the group III nitride semiconductor having the composition same or similar to AlN or the above mentioned n-type layer, in between the substrate 11 and the n-type layer 12.

<Active Layer>

The active layer 13 is formed of the laminate structure including a quantum well layer constituted of $Al_xIn_yGa_zN$ (x, y, and z are rational numbers satisfying $0<x\leq1.0$, $0\leq y\leq0.1$, $0\leq z<1.0$, and $x+y+z=1.0$), and a barrier layer constituted of $Al_xIn_yGa_zN$ (x, y, and z are rational numbers satisfying $0<x\leq1.0$, $0\leq y\leq0.1$, $0\leq z<1.0$, and $x+y+z=1.0$) having larger band gap energy than said quantum well layer. The active layer may be a multiple quantum well layer structure, or it may be a single quantum well structure.

The thickness of the quantum well layer is 1 nm or more, preferably 2 nm or more, and the upper limit is 100 nm. The thickness of the barrier layer is 1 nm or more, preferably 2 nm or more, and the upper limit is 1 Such active layer can be produced by MOCVD method.

<P-Type Layer>

The p-type layer 14 is constituted from the p-type clad layer and the p-type contact layer. The p-type clad layer is a group III nitride semiconductor constituted by $Al_xIn_yGa_zN$ (x, y, and z are rational numbers satisfying $0<x\leq1.0$, $0\leq y\leq0.1$, $0\leq z<1.0$, and $x+y+z=1.0$), and preferably it includes impurity.

The impurity of the p-type clad layer is preferably Mg. The concentration of impurity in the p-type clad layer is $1.0\times10^{17}$ $cm^{-3}$ or more and $5.0\times10^{20}$ $cm^{-3}$ or less; and preferably $1.0\times10^{18}$ $cm^{-3}$ or more and $5.0\times10^{20}$ $cm^{-3}$ or less. The thickness of the p-type clad layer is 5 nm or more and 100 nm or less, and preferably 10 nm or more and 80 nm or less.

The p-type contact layer is a group III nitride semiconductor constituted by $Al_xIn_yGa_zN$ (x, y, and z are rational numbers satisfying $0<x\leq1.0$, $0\leq y\leq0.1$, $0\leq z<1.0$, and $x+y+z=1.0$). Preferably, the p-type contact layer is constituted of GaN. By constituting the p-type contact layer by GaN that is by p-GaN layer, then the contact characteristic of the p-type contact layer can be improved. Also, the p-type contact layer preferably includes the impurity.

The impurity of the p-type contact layer is preferably Mg as similar to the p-type clad layer. The concentration of impurity in the p-type contact layer is $1.0\times10^{17}$ $cm^{-3}$ or more and $2.0\times10^{20}$ $cm^{-3}$ or less; and preferably $1.0\times10^{18}$ $cm^{-3}$ or more and $5.0\times10^{20}$ $cm^{-3}$ or less. The thickness of the p-type contact layer is 1 nm or more and 200 nm or less, and preferably 5 nm or more and 50 nm or less. By having the thickness of the p-type contact layer within the above mentioned range, the contact characteristic of the p-type layer improves.

<N-Electrode>

The n-electrode 16 is formed on the exposed face of the n-type layer 12. The exposed face of the n-type layer is formed by the means of etching or so. By forming the exposed face of the n-type layer, the laminate semiconductor layer remains in a plateau shape; thereby the mesa structure 15 is formed. The n-electrode on the n-type layer is formed at the lower part of the mesa edge along the lower mesa edge of the mesa structure, however it may be a structure wherein a space is slightly taken from the lower mesa edge of the mesa structure, and the n-type layer 12 may be exposed between the mesa structure 15 and the n-electrode 16.

From the top view of the group III nitride semiconductor element 40, the n-electrode 16 may be formed so as to surround the entire p-electrode 17 along the mesa edge, or the n-electrode may surround part of the p-electrode. Alternatively, the p-electrode may be formed so as to surround the n-electrode.

As the method of etching, for example a dry etching such as reactive ion etching, and inductive coupling plasma etching or so may be mentioned. After forming the exposed face of the n-type layer 12, in order to remove the damage by the etching, preferably the exposed face is carried out with a surface treatment by acid or alkali. Then, the n-electrode 16 having an ohmic characteristic is formed to the exposed face of the n-type layer.

The n-electrode can be formed by a lift-off method. As the lift-off method, a photoresist is coated to the face where the electrode is to be formed, and the ultraviolet ray is irradiated using the UV exposure machine having a photomask. Then, it is immersed in the developing solution to dissolve the photoresist exposed to the light thereby the desired pattern is formed. Then, an electrode metal is deposited on the photoresist, and the photo-resist is dissolved by a stripping solution thereby the electrode metal is formed. Also, as other method of forming, the electrode metal film is formed on the electrode forming face, and the photoresist is coated, then the photoresist is formed via the steps of light exposing and developing. Then, the dry etching or wet etching is carried out using the photo-resist as a mask to form the electrode metal, and dissolving the photo-resist by stripping solution. The lift-off method is preferable since the steps are relatively simple.

As the method for depositing the n-electrode metal, for example, a chemical vapor phase method such as the vacuum evaporation and spattering or so may be mentioned. Particularly, the vacuum evaporation method is preferable because the impurity included in the electrode metal can be removed. The material used for the n-electrode can be selected from the known materials. For example, Ti, Al, Rh, Cr, In, Ni, Pt and Au or so may be mentioned. Among these, Ti, Al, Rh, Cr, Ni and Au are preferable. Particularly, the combination of Ti, Al and Au are preferable since the ohmic characteristic and the reflection factor can be improved. The n-electrode may be a single layer or a multiple layer structure including alloy or oxides of these metals.

The thickness of the n-electrode is not particularly limited, but considering the stability of the production, it is preferably 2 nm or more and the upper limit is 2 µm.

Figure 2A:
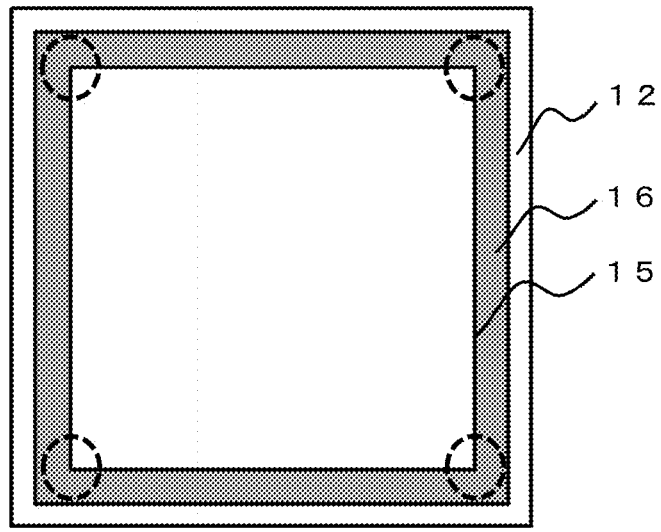
FIG. 2A is an example of the group III nitride semiconductor element viewing from the top.
Figure 2B:
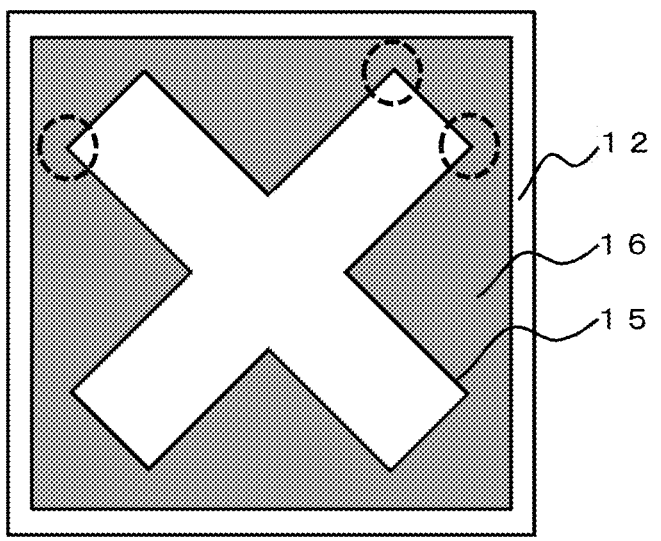
FIG. 2B is an example of the group III nitride semiconductor element viewing from the top.
Figure 2C:
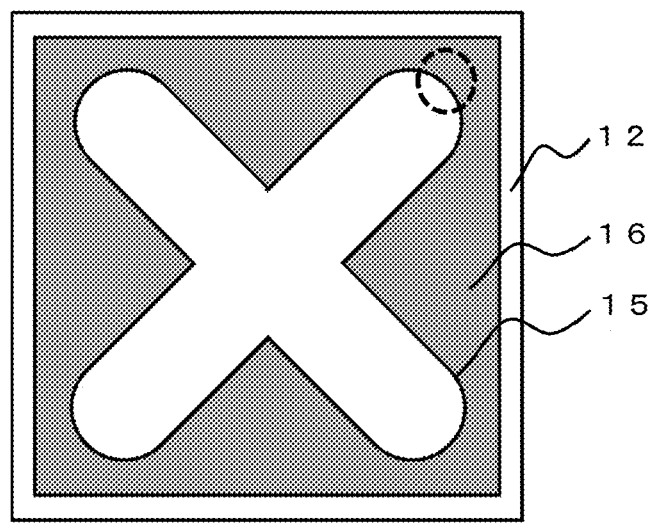
FIG. 2C is an example of the group III nitride semiconductor element viewing from the top.
Figure 2D:
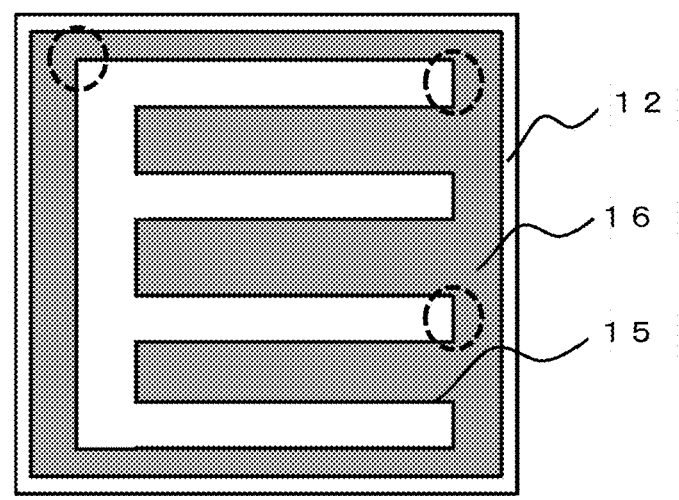
FIG. 2D is an example of the group III nitride semiconductor element viewing from the top.
Figure 2E:
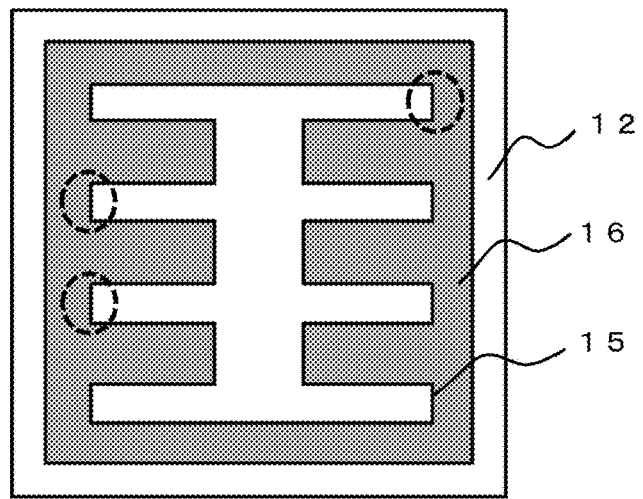
FIG. 2E is an example of the group III nitride semiconductor element viewing from the top.
Figure 2F:
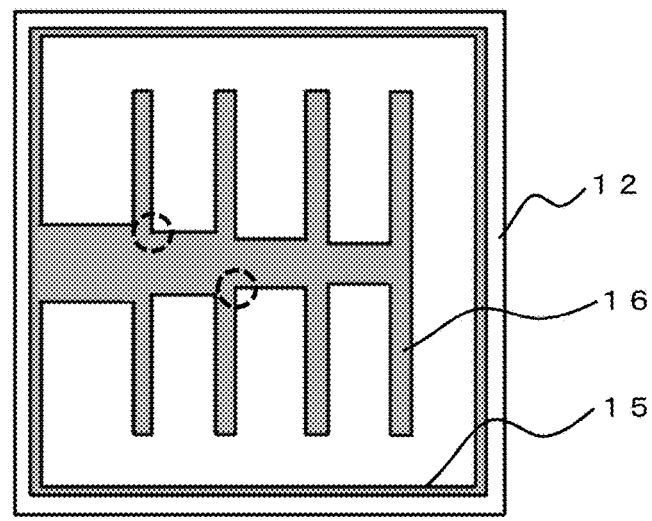
FIG. 2F is an example of the group III nitride semiconductor element viewing from the top.
Figure 2G:
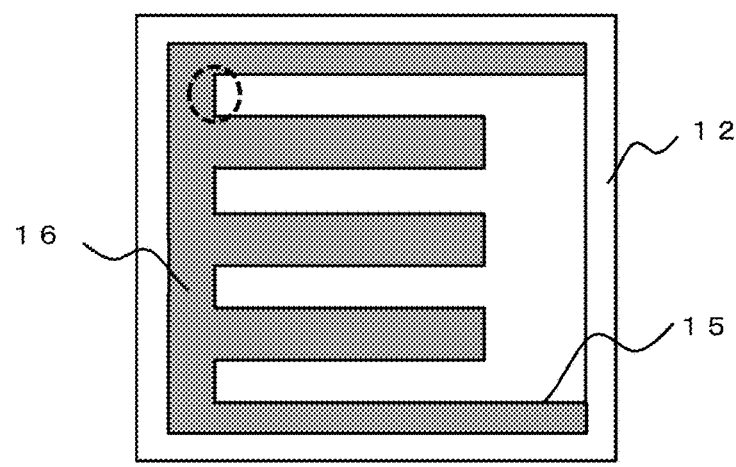
FIG. 2G is an example of the group III nitride semiconductor element viewing from the top.

As shown in FIG. 2, the type of the n-electrode is not particularly limited, and it may be formed so as to surround the entire mesa structure 15 along the mesa edge (FIG. 2A to FIG. 2F), or it may be formed so that the n-electrode surrounds part of the mesa structure 15 (FIG. 2G). Also, the n-electrode may be formed so as to surround the p-electrode (FIG. 2A to FIG. 2E and FIG. 2G), or it may be other way around and the p-electrode may be formed so as to surround the n-electrode (FIG. 2F).

As shown in FIG. 2F, in case the n-electrode has the linear part, the width of the n-electrode is not particularly limited, but usually it is 5 to 100 µm or so, and preferably 10 to 50 µm. In this case, the width of the n-electrode may not be uniform. For example, the part having a wide width and narrow width may coexist. In this case, the average width of the n-electrode may be within the above mentioned range of width.

In order to improve the contact characteristic with the n-type layer, after depositing the n-electrode metal, preferably a heat treatment is carried out at 300° C. to 1100° C. for 30 seconds to 3 minutes. The temperature and time of the heat treatment can be selected from the most suitable condition depending on the metal type and the thickness of the n-electrode.

<P-Electrode>

The p-electrode 17 of the present invention is made of the p-type electrode structure 30. The p-type electrode structure 30 is laminated with the first metal layer 18, the conductive layer 19, and the second metal layer 20 in this order. According to the present inventor, the p-electrode 17 of the group III nitride semiconductor element has the p-type electrode structure 30 laminated with the first metal layer 18, the conductive layer 19, and the second metal layer 20 in this order, thereby the current is suppressed from concentrating, and the decrease of the luminescence efficiency is suppressed.

When using the p-electrode having low contact resistance in the group III nitride semiconductor element having a mesa structure, if the driving voltage is applied to the p-electrode and the n-electrode, the current runs the pathway having a low resistance (usually the shortest pathway) between the p-electrode and the n-electrode, thus the current concentrates near the area of the mesa edge close to the n-electrode and the p-electrode.

For the group III nitride semiconductor element having the p-electrode 17 made of the p-type electrode structure 30 of the present invention, when the driving voltage is applied, the current tends to run the pathway having low resistance between the second metal layer 20 and the first metal layer 18 in the p-type electrode structure constituting the p-electrode. The conductive layer 19 which is right below the second metal layer 20 has higher specific resistance than the first metal layer 18 which is right below the conductive layer, hence the current conducts in the conductive layer in a shortest pathway, and thus the current tends to run to the first metal layer 18. That is, the conductive layer 19 having high specific resistance is present between the second metal layer 20 and the first metal layer 18, thereby the current is suppressed from concentrating to the area near the mesa edge, and as a result the current can run inside the laminate semiconductor layer without locally concentrating.

Also, the first metal layer 18 is formed so to ohmically contact with the p-type layer 14 which is right below the first metal layer 18, hence the driving voltage does not become too large.

Further, for the present invention, by making the specific resistance of the conductive layer 19 high, the specific resistance of the conductive layer 19 becomes closer to the specific resistance of the n-type layer 12. As a result, the value of the scattering length $L_s$ of the n-type layer 12 become large, the scattering distance of the electron in the n-type layer increases, and the current concentration near the mesa edge in the n-type layer is suppressed. That is, due to the conductive layer 19 having high specific resistance, the current flows to the active layer 13 without locally concentrating, and the luminescence efficiency is suppressed from decreasing.

Therefore, according to the present invention, the current is suppressed from locally concentrating in the above mentioned p-type electrode structure 30. As a result, the current running between the p-electrode 17 made of the p-type electrode structure 30 and the n-electrode 16 is suppressed from concentrating to the area near the mesa edge, and the decrease of the luminescence efficiency is suppressed.

The first metal layer 18, the conductive layer 19, and the second metal layer 20 forming such p-type electrode structure 30 will be explained in below.

<First Metal Layer>

The first metal layer 18 is formed so to ohmically contact with the p-type layer 14.

The metal material used for the first metal layer 18 is preferably Ni, Au, Pt, Pd, Ru, Os, Rh, Ir, and Ag; and further preferably Ni, Au, Pt, and Pd. Among these, the material having lower specific resistance than the material constituting the conductive layer 19 which will be discussed in below may be selected. For the first metal layer, these metals may be used alone, or two or more may be combined. Also, the first metal layer 18 may be a single layer or a multiple layer structure including alloy or oxides of these metals.

The specific resistance of the first metal layer 18 is preferably $1 \times 10^{-6}$ to $2 \times 10^{-5}$ Ωcm, and more preferably $1 \times 10^{-6}$ to $1 \times 10^{-5}$ Ωcm. The specific resistance of the first metal layer 18 is lower than the specific resistance of the conductive layer 19 which will be discussed in below.

From the point of the productivity, the thickness of the first metal layer 18 is 1 nm or more and 200 nm or less, and more preferably 2 nm or more and 100 nm or less.

The first metal layer 18 is preferably formed by the lift-off method as similar to the n-electrode. The shape and the size of the first metal layer 18 is almost the same as the mesa structure 15. The first metal layer 18 may be formed as a similar shape as the mesa structure 15 but slightly smaller. Preferably, the first metal layer 18 is formed to the entire face of the laminate face of the p-type layer.

As the method of depositing the first metal layer 18, as similar to the method of forming the n-electrode, for example the vacuum evaporation, spattering and chemical vapor phase deposition method or so may be mentioned. Particularly, the vacuum evaporation is preferable because the impurity in the electrode metal can be removed. In order to improve the contact characteristic with the p-type layer 14, preferably after depositing the metal, a heat treatment is carried out at 200° C. to 800° C. for 30 seconds to 3 minutes. The temperature and time of the heat treatment can be selected from the most suitable condition depending on the metal type and the thickness of the first metal layer.

<Conductive Layer>

The conductive layer 19 is formed on the first metal layer.

The material used for the conductive layer 19 is preferably ZnO, a material doped with Al in ZnO (hereinafter, it will be simply referred as "AZO"), a material doped with Sb in $SnO_2$ (hereinafter, it will be simply referred as "ATO"), a material doped with Ge in ZnO (hereinafter, it will be simply referred as "GZO"), the conductive materials made of oxides such as $Zn_{1-x}Mg_xO$, $SnO_2$, $RuO_2$, PdO, $Bi_2Ru_2O_7$, $Bi_2Ir_2O_7$, ITO (Indium-Tin Oxide) or so, Ge, Si, and Ti; and more preferably it is ZnO, AZO, ITO, ATO, GZO, Ge, Si, and Ti.

The specific resistance of the conductive layer 19 is preferably $0.1 \times 10^{-4}$ to $1.0 \times 10^{-2}$ Ωcm, and more preferably $0.5 \times 10^{-4}$ to $1.0 \times 10^{-2}$ Ωcm. The specific resistance of the conductive layer 19 is higher than the specific resistance of the first metal layer 18.

In the present invention, in order to exhibit the effect of suppressing the current flowing in the conductive layer from concentrating to the area near the mesa edge, and also the effect of suppressing the driving voltage from becoming too large, the specific resistance of the conductive layer 19 is preferably 2 to 1000 times of the specific resistance of the first metal layer 18, more preferably 4 to 1000 times, further preferably 4 to 500 times, and particularly preferably 4 to 100 times.

The thickness of the conductive layer 19 is preferably 0.05 μm or more and 20 μm or less, and more preferably 0.05 μm or more and 10 μm or less. If the conductive layer is too thick, the driving voltage may become too big. If the conductive layer is too thin, the current may not sufficiently spread in the conductive layer, and the current may not be effectively suppressed from concentrating to the area near the mesa edge.

The shape and the size of the conductive layer 19 is almost the same as the mesa structure 15. The conductive layer 19 may be formed as a similar shape as the mesa structure 15 but slightly smaller. Preferably, the conductive layer 19 is formed to the entire face of the laminate face of the first metal layer. The conductive layer is formed by a vacuum evaporation, a spattering method, and MBE method or so.

<Second Metal Layer>

The second metal layer is formed on the conductive layer.

The metal material used for the second metal layer 20 is preferably Ti, Ni, Pt, Au, Mo, and W, and further preferably Ti, Ni, Pt, and Au. As the second metal layer 20, these metals may be used alone, and two or more may be combined. Also, the second metal layer 20 may be a single layer or a multiple layer structure including alloy or oxides of these metals.

The specific resistance of the second metal layer 20 is not particularly limited. Usually, the specific resistance of metal is smaller compared to the specific resistance of the material used for said conductive layer. Among these, in order to exhibit excellent effect, the specific resistance of the second metal layer 20 is $1.0 \times 10^{-6}$ to $5.0 \times 10^{-5}$ Ωcm, and more preferably $2.0 \times 10^{-6}$ to $5.0 \times 10^{-5}$ Ωcm.

The thickness of the second metal layer 20 is preferably 0.05 μm or more and 10 μm or less, and more preferably 0.10 μm or more and 7 μm or less. If the second metal layer is too thick, the stress generated inside of the second metal layer becomes large, and the second metal layer may easily peel off. If the second metal layer is too thin, a heat dissipation property decreases, and also when using as the semiconductor element a solder may easily disperse.

The second metal layer 19 is preferably formed by the lift-off method as similar to the n-electrode. As the method of depositing the second metal layer 20, as similar to the method of forming the n-electrode, for example the vacuum evaporation, spattering and chemical vapor phase deposition method or so may be mentioned. Particularly, the vacuum evaporation is preferable because the impurity in the electrode metal can be removed.

The shape and the size of the second metal layer 20 may be same as the mesa structure 15, or it may be the shape and size completely different from the mesa structure. In the preferable embodiment of the present invention, among the p-type electrode structure 30, the position of forming the second metal layer 20 can be determined based on the predetermined standard relating to the shape of the mesa structure 15. Thereby, the current concentration to the mesa edge can be further suppressed.

The second metal layer 20 may be formed as a similar shape as the mesa structure 15 but slightly smaller. In this case, the shape of the second metal layer 20 may be a rectangular parallelepiped shape which is almost the same shape as the mesa structure 15 as shown in FIG. 2A, or it may be a cross shape as shown in FIGS. 2B and 2C, or it may be a comb shape as shown in FIG. 2D to 2G. The width of the second metal layer is not particularly limited, but in case of the shape similar to the mesa structure 15 as shown in FIG. 2B to FIG. 2G, usually the width is 5 to 100 μm or so, and preferably 10 to 50 μm or so. The width of the second metal layer may not be uniform. For example, the part having a wide width and narrow width may coexist. In this case, the average width of the second metal layer may be within the above mentioned range.

<Type of Second Metal Layer>

Figure 8A:
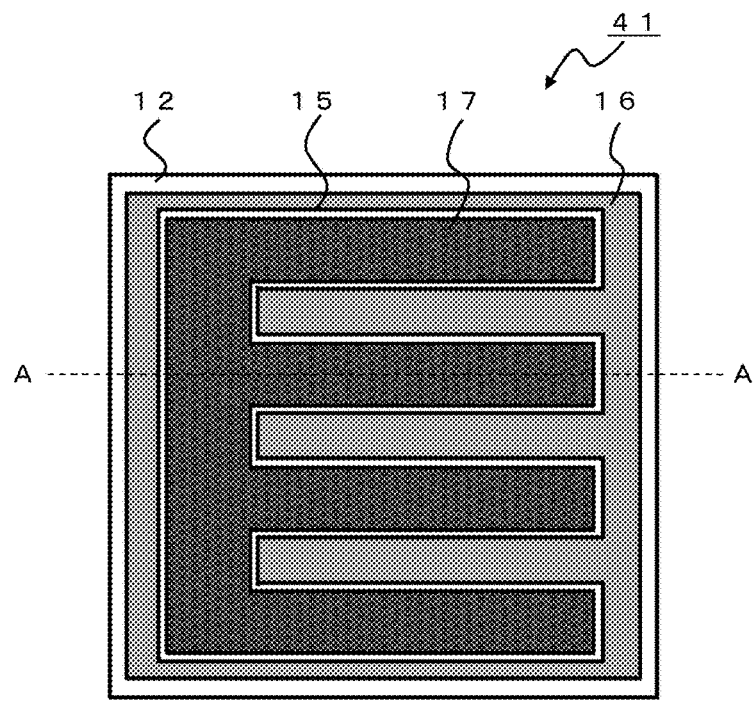
FIG. 8A shows the example of the typical group III nitride semiconductor luminescence element viewing from the top.
Figure 8B:
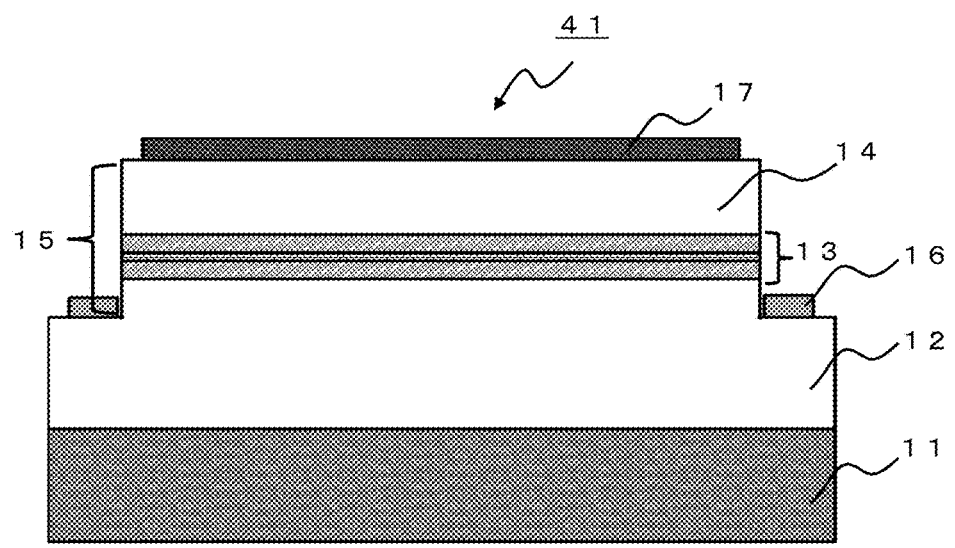
FIG. 8B shows the cross section of the typical group III nitride semiconductor luminescence element.

As shown in FIG. 8, in the conventional group III nitride semiconductor luminescence element 41, the p-electrode 17 is formed almost the same as the mesa structure 15 on the p-type layer 14 positioned at the upper part of the mesa structure 15 of a plateau shape. The n-electrode 16 is formed at the lower part when viewed from the mesa structure 15. Regarding the conductivity between the n-electrode 16 and the p-electrode 17, the pathway with a lower resistance will have a priority, thus the current tends to concentrate to the area near the edge part of the mesa structure 15 having the shortest distance between the n-electrode and the p-electrode.

In order to suppress the current concentration at the mesa edge, the group III nitride semiconductor element 40 of the present invention has the p-electrode 17 laminated with the first metal layer 18, the conductive layer 19, and the second metal layer 20 in this order. Further, in the preferable embodiment of the present invention, the first metal layer 18 and the conductive layer 19 are formed to the entire face of the laminate face of the mesa part, and as for the formation of the second metal layer 20, a certain distance or more can be provided between the mesa edge and the second metal layer 20 in order to suppress the current concentration at the mesa edge.

That is, in the preferable embodiment of the present invention, when the group III nitride semiconductor element is viewed from the top, the distance between the mesa edge and the outer peripheral of the second metal layer 20 can be ⅓ or more of the scattering length $L_s$. The distance between the mesa edge and the outer peripheral of the second metal layer 20 refers to the shortest pathway from the arbitrary selected mesa edge to the outline of the second metal layer 20. By setting the distance between the mesa edge and the outer peripheral of the second metal layer 20 to ⅓ or more of the scattering length $L_s$, the current concentration near the mesa edge can be further suppressed, thus the current easily flows evenly into the active layer and suppresses the uneven luminescence, and the decrease of the luminescence efficiency can be suppressed.

In the preferable embodiment of the present invention, the distance between the mesa edge and the outer peripheral of the second metal layer is preferably ⅓ or more of the scattering length $L_s$, more preferably ⅓ or more of the scattering length $L_s$ and 1.2 times or less of the scattering length $L_s$, and even more preferably ⅓ or more of the scattering length $L_s$ and 1.0 times or less of the scattering length $L_s$.

Also, in the preferable embodiment of the present invention, for all of the mesa edges, the distance between the mesa edge and the outer peripheral of the second metal layer may be ⅓ or more of the scattering length $L_s$. By making the distance between the mesa edge and the outer peripheral of the second metal layer to ⅓ or more of the scattering length $L_s$ for all of the mesa edges, the current concentration near the mesa edge can be further suppressed, thus the current easily flows evenly to the active layer and suppresses the uneven luminescence, and the decrease of the luminescence efficiency can be suppressed.

In the preferable embodiment of the present invention, for all of the mesa edges, the distance between the mesa edge and the outer peripheral of the second metal layer is preferably ⅓ or more of the scattering length $L_s$, more preferably ⅓ or more of the scattering length $L_s$ and 1.2 times or less of the scattering length $L_s$, and even more preferably ⅓ or more of the scattering length $L_s$ and 1.0 times or less of the scattering length $L_s$.

Further, in the preferable embodiment of the preset invention, the distance between a part of the mesa edge and the outer peripheral of the second metal layer can be ⅓ or more of the scattering length $L_s$. If the distance between the mesa edge and the outer peripheral of the second metal layer is ⅓ or more of the scattering length $L_s$ for all of the mesa edges, the area of the second metal layer becomes small, and the resistance of the current flowing between the p-electrode 17 and the n-electrode 16 increases, and the driving voltage may increase. By making the distance between a part of the mesa edge and the outer peripheral of the second metal layer to ⅓ or more of the scattering length $L_s$, the second metal layer can be formed wide, and the resistance of the current flowing between the p-electrode 17 and the n-electrode 16 is suppressed from increasing, and the increase of the driving voltage can be suppressed.

In the preferable embodiment of the present invention, the distance between a part of the mesa edge and the outer peripheral of the second metal layer is preferably ⅓ or more of the scattering length $L_s$, more preferably ⅓ or more of the scattering length $L_s$ and 1.2 times or less of the scattering length $L_s$, and even more preferably ⅓ or more of the scattering length $L_s$ and 1.0 times or less of the scattering length $L_s$.

Further, from the point of suppressing the current concentration and further suppressing the increase of the driving voltage, in the preferable embodiment of the present invention, a part of the mesa edge, particularly at a part where the current concentration tends to occur, the distance between the mesa edge and the outer peripheral of the second metal layer 20 can be ⅓ or more of the scattering length $L_s$.

The part where the current concentration tends to occur refers to the part of the p-electrode 17 projecting out to the area where the n-electrode is formed, when viewed from the top. In this part, the p-electrode 17 is surrounded by the n-electrode 16, thus the current easily concentrates. As a result, such part emits stronger light, but easily deteriorates because the load is also big. Also, at the part where the current concentrates, the stronger light is emitted, but on the other hand, weaker light is emitted for other parts, hence the uneven luminescence occurs and the luminescence efficiency decreases. Therefore, in case of forming the shape of the second metal layer 20 among the p-type electrode structure constituting the p-electrode on the mesa structure 15 to be as same as the mesa structure, at least at the part where the mesa structure 15 is projecting out to the area formed with the n-electrode, that is at least at the projection part of the mesa edge which will be discussed in below, a predetermined distance or more is taken between the mesa edge and the second metal layer 20, thereby the current running from the second metal layer 20 can flow to the conductive layer right below the second metal layer 20 without concentrating to the edge part of the mesa structure.

Therefore, for the group III nitride semiconductor element of the present invention having the p-electrode 17 laminated with the first metal layer 18, the conductive layer 19, and the second metal layer 20 in this order, by having predetermined distance or more between the second metal layer 20 and at least the part of the mesa structure 15 projecting out to the area where the n-electrode is formed, that is at least the projection part of the mesa edge, the increase of the driving voltage can be suppressed even more, and also the current concentration to the edge part of the mesa structure of the laminate semiconductor layer can be suppressed.

Therefore, for the preferable embodiment of the present invention, the distance between the outer peripheral of the second metal layer 20 and at least the projection part of the mesa edge is preferably ⅓ or more of the scattering length $L_s$, more preferably ⅓ or more of the scattering length $L_s$ and 1.2 times or less of the scattering length $L_s$, and even more preferably ⅓ or more of the scattering length $L_s$ and 1.0 times or less of the scattering length $L_s$. On the other hand, at the part where the current concentration rarely occurs, the mesa edge and the outer peripheral of the second metal layer 20 approaches close to each other, and the distance between the outer peripheral of the second metal layer and the n-electrode may be less than ⅓ of the scattering length $L_s$.

Note that, the scattering length $L_s$ is defined by the below equation.

$$L_s = \{(\rho_c + \rho_p t_p) t_n / \rho_n\}^{1/2}$$

Here, $\rho_c$: a contact resistance between p-electrode/p-type layer, and between n-electrode/n-type layer, $\rho_p$: a specific resistance of the p-type layer, $\rho_n$: a specific resistance of the n-type layer, $t_p$: a thickness of p-type layer, and $t_n$: a thickness of n-type layer.

(Method of Measuring the Contact Resistance)

The contact resistance is measured by TLM (Transfer Length Method). First, by the same method as the production method of the semiconductor element, p-electrode pattern having the second metal layer non-formed area having a donut shape is formed on the p-GaN surface (the distance between the electrodes: 5, 10, 20, 40, 60, 80, 100 μm). Using the obtained electrode pattern, the resistance between each electrode distance is measured; thereby the contact resistance between the p-electrode/p-type layer and the n-electrode/n-type layer are calculated from the relation between the resistance and the distance between the electrodes.

(Method of Measuring the Specific Resistance)

Using the same method as the production method of the semiconductor element, to the surface of four corners of p-GaN layer, p-AlGaN layer and n-AlGaN layer of a square having 7 mm on one side, four n-electrodes and p-electrodes having the p-type electrode structure of a circular shape having diameter of 1.5 mm are formed respectively. For the obtained samples, a Hall Effect measurement is carried out; thereby the specific resistance of the p-type layer (p-GaN layer, p-AlGaN layer) and n-type layer (n-AlGaN layer) are calculated.

When the current runs the luminescence element, the electron will move from the n-layer to the p-layer. Considering the movement of the electron to the p-type layer, the scattering length $L_s$ refers to the distance of which most of the electron can scatter in the n-type layer towards the mesa edge from the end of the n-electrode closer to the mesa edge.

Since the scattering length $L_s$ does not depend on the electrode width, it is used as the standard for the device design to suppress the current concentration even in case the element becomes compact and the electrode becomes narrower.

As mentioned in above, in the preferable embodiment of the present invention, the group III nitride semiconductor element has the p-electrode 17 laminated with the first metal layer 18, the conductive layer 19, and the second metal layer 20 in this order, and the distance between the mesa edge and the outer peripheral of the second metal layer 20 can be ⅓ or more of the scattering length $L_s$, but for the art at the time of the present invention, 20 μm or more should be sufficient as the distance between the mesa edge and the outer peripheral of the second metal layer 20.

Therefore, for the preferable embodiment of the present invention, from the point of further suppressing the current concentration, the distance between the mesa edge and the outer peripheral of the second metal layer 20 is preferably 20 μm or more, more preferably 20 to 80 μm, and further preferably 20 to 40 μm. From the point of further suppressing the current concentration, for all of the mesa edges, the distance between the mesa edge and the outer peripheral of the second metal layer 20 is preferably 20 μm or more, more preferably 20 to 80 μm, and further preferably 20 to 40 μm. Also, from the point of suppressing the increase of the driving voltage, the distance between a part of the mesa edge and the outer peripheral of the second electrode metal layer 20 is preferably 20 μm or more, more preferably 20 to 80 μm, and further preferably 20 to 40 μm. Further, from the point of suppressing the current concentration and even more suppressing the increase of the driving voltage, the distance between at least the projection part of the mesa edge and the outer peripheral of the second metal layer 20 is preferably 20 μm or more, more preferably 20 to 80 μm, and further preferably 20 to 40 μm. This distance is a sufficient value for the current (2015) element design. However, in case the element is further downsized, and the electrode becomes narrower, the distance between a part of the mesa edge and the outer peripheral of the second electrode metal layer 20 may be impossible to have 20 μm or more in some case. In such case, the distance between the mesa edge and the outer peripheral of the second metal layer 20 is set based on the scattering length $L_s$.

In other words, in the preferable embodiment of the present invention, the group III nitride semiconductor element has the p-electrode 17 laminated with the first metal layer 18, the conductive layer 19, and the second metal layer 20 in this order, and a second metal layer restricted area of which the second metal layer is restricted from forming can be provided between the mesa edge and the second metal layer 20. That is, for the preferable embodiment of the present invention, the second metal layer restricted area having the width of ⅓ or more of the scattering length $L_s$, or the width of 20 μm or more is present near the edge part of the mesa structure.

The above mentioned second metal layer restricted area can be provided near all of the mesa edges. By providing the above mentioned second metal layer restricted area to the area near all of the mesa edges, the current concentration can be further suppressed, and the current tends to easily flow evenly to the active layer, thus the uneven luminescence is suppressed, and the decrease of the luminescence efficiency can be suppressed.

Also, the above mentioned second metal layer restricted area can be provided to the area near a part of the mesa edges. If the above mentioned second metal layer restricted area is provided to the area near all of the mesa edges, the area of the second metal layer becomes small, and the resistance of the current flowing between the p-electrode and the n-electrode increases, and the driving voltage might increase. By forming the above mentioned second metal layer restricted area to the area near a part of the mesa edges, the second metal layer can be formed widely, and the resistance of the current flowing between the p-electrode and the n-electrode is suppressed from increasing, and the increase of the driving voltage can be suppressed.

Further, from the point of suppressing the current concentration and also further suppressing the increase of the driving voltage, the above mentioned second metal layer restricted area can be at least provided near the projection part of the mesa edge. That is, for the preferable embodiment of the present invention, the second metal layer restricted area having the width of ⅓ or more of the scattering length $L_s$ or the width of 20 μm or more is provided between the mesa edge and the second metal layer 20 for at least the projection part of the mesa edge, thereby the increase of the driving voltage can be suppressed, and further the current concentration to this area can be suppressed because the current barely flows to this area.

Here, "the projection part of the mesa edge" refers to the part where the outline of the mesa structure 15 is projecting out to the n-electrode forming area, when viewed from the top. If the second metal layer is formed to this part, the electron from the n-electrode surrounding the second metal layer will concentrate to the second metal layer which is formed to this part, and the active layer part right below the second metal layer emits strong light, but the light emitted from other parts is weak, thus uneven luminescence tends to easily occur. In addition to this, the laminate semiconductor layer right below the second metal layer of this part easily deteriorates.

The outline of the mesa structure 15 varies depending on the type of the electrode of the element design. Therefore, "the projection part of the mesa edge" is difficult to define.

Hence, non-limiting examples regarding the outline of the mesa structure 15 and the type of the n-electrode viewing from the top of the element are shown in FIG. 2, and the "the projection part of the mesa edge" where the current easily concentrates are shown by a circle of broken line. Note that, from the top view in FIG. 2, the n-electrode 12 and the mesa structure 15 are in contact, but at the cross section shown in FIG. 1, a taper part of the mesa structure or the exposed n-type layer may be present between the edge part of the mesa structure 15 and the n-electrode. Also, for the group III nitride semiconductor element, the second metal layer is formed by taking a predetermined distance from "the projection part of the mesa edge", and the second metal layer restricted area is formed where the second metal layer formation is restricted at the area less than the predetermined distance.

FIG. 2A shows the element structure having the mesa structure 15 of the rectangular parallelepiped shape when viewed from the top. In this structure, each corner point of the rectangular parallelepiped shape projects out to the area where the n-electrode is formed, and if the second metal layer 20 is formed to this part, the current tends to concentrate to the mesa part right below the second metal layer.

FIG. 2B shows the cross shaped mesa structure 15. In this structure, each corner point of the cross projects out to the n-electrode forming area.

FIG. 2C shows the mesa structure 15 having a cross shape of which the edge part is round. In this structure, the edge part of the cross projects out to the n-electrode forming area.

FIG. 2D shows the mesa structure 15 having the comb shape. In this structure, each tip of the comb and the corner point of the rectangular parallelepiped shape project out to the n-electrode forming area.

FIG. 2E is a modified example of FIG. 2D, and it shows the structure where the electrode extends in a comb teeth shape from the backbone of the comb.

FIG. 2F shows the structure wherein the n-electrode has a linear part, and further the electrode also extends from the backbone of comb which is forming the n-electrode.

FIG. 2G shows the n-electrode of comb shape surrounding the mesa structure having a comb shape.

In the constitutions shown in the figures, each tip of the comb and the corner point of the rectangular parallelepiped shape which are the second metal layer projecting out to the n-electrode forming area. In the group III nitride semiconductor element according to the present invention, for the type of the mesa structure having the constitution shown in the figures or having the similar constitution may not have the second metal layer at the area less than the predetermined distance from the center of the circle which shows the "the projection part of the mesa edge".

Also, "the projection part of the mesa edge" can be also defined as the mesa part where the n-electrode exists too much in the surrounding, when viewing the group III nitride semiconductor element from the top. Therefore, in order to determine whether "certain point" of the mesa edge corresponds to "the projection part of the mesa edge", the area of the n-electrode existing around said "certain point" may be considered. Specifically, a circle having a predetermine radius is drawn (hereinafter, this may be referred as "the reference circle") using "the certain point" as a center as the subject to be evaluated, when the area of the n-electrode present in the circle is large, then this means that the ratio of said "certain point" surrounded by the n-electrode is high. Alternatively, a circle having a predetermine radius is drawn using "the certain point" as a center as the subject to be evaluated, and when the area of the mesa part (including the p-electrode) present inside of the circle is small, then this means that the ratio of said "certain point" surrounded by the n-electrode is high.

Figure 3:
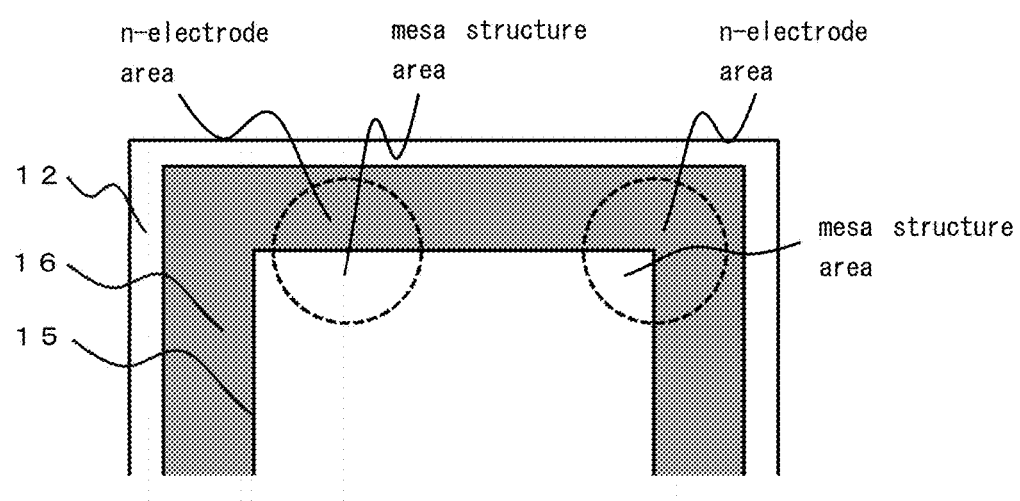
FIG. 3 shows the method of determining "the projection part of the mesa edge" using a reference-circle.

From this point of view, as shown in FIG. 3, in order to determine whether "certain point" of the mesa edge corresponds to "the projection part of the mesa edge", the following evaluation parameter is proposed using the area of the n-electrode and the mesa part (including the p-electrode and the p-type layer) in the predetermined circle which uses the "certain point" of the mesa edge as the center.

Evaluation parameter=($n$-electrode area/mesa structure area)×100(%)

The larger the parameter is, the higher the ratio of "the certain point" surrounded by the n-electrode is, and will be determined as positioned in "the projection part of the mesa edge".

The radius of the reference circle only needs to be about the size so that the circle and other mesa edge does not contact. However, if the circle is too small, the taper part between the mesa edge and the n-electrode, and the area of the exposed n-type layer will be over calculated, thus the circle needs to be a certain size or more. That is, if the reference circle at the mesa edge is too small, the area of the taper part of the mesa part and the area of the exposed n-type layer will be over calculated in the reference circle, thus the total area of the mesa part (including the p-electrode) and the n-electrode relatively decreases, and an appropriate evaluation cannot be done.

Therefore, using the arbitrary point (the point subjected to the evaluation) on the mesa edge as the center point, the circle having the radius $r_n$ which gradually becomes larger is drawn. When the radius of the circle is small, the relative ratio of the area of the taper part and the area of the n-electrode is large, and as the circle becomes large, the relative ratio thereof becomes small; hence the area of the mesa part (including the p-electrode) and the n-electrode can be evaluated appropriately. Therefore, the radius of the reference circle is preferably the radius of the circle wherein the total ratio of the mesa part (including the p-electrode) and the n-electrode in the circle is 80% with respect to the entire area of the circle. Note that, the radius of the reference circle does not have to be large unless the reference circle contacts with other mesa edge.

The method of determining "the projection part of the mesa edge" using the reference circle will be explained by referring to FIG. 2. When the reference circle is drawn by using a certain point on the mesa edge as the center, the mesa part (p-electrode), the n-type layer, and the n-electrode are present in the reference circle, and the taper part of the mesa structure may be observed from the top view. In this circle, the above mentioned evaluation parameter is calculated from the area of the mesa part, the area of the electrode and the entire area of the circle. In FIG. 3, the p-electrode is not shown. In the preferable embodiment of the present invention, among the p-type electrode structure 30 constituting the p-electrode 17, the first metal layer 18 and the conductive layer 19 are formed to have the same shape as the mesa part, and the second metal layer 20 has the same shape as the mesa part or it can be smaller than the mesa part.

Figure 4:
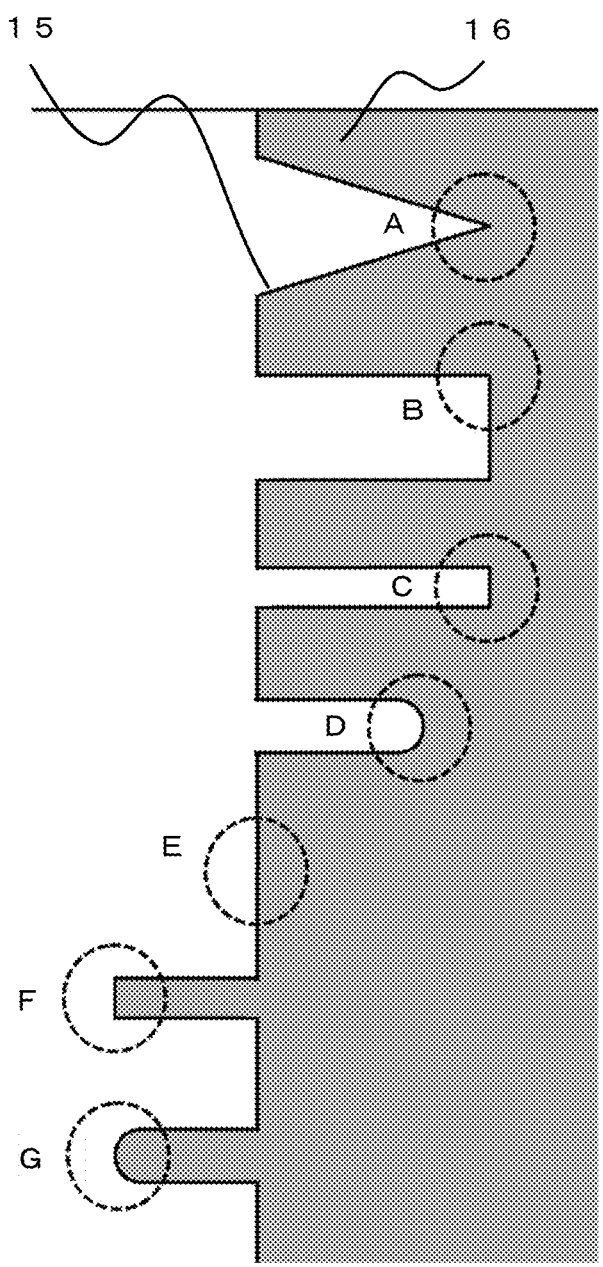
FIG. 4 shows various shape of the mesa edge.

In FIG. 4, the mesa edge having various outline are schematically shown when viewing the n-electrode from the top. Note that, in FIG. 4, the area of the exposed n-type layer and the taper part between the electrodes are small, thus it is not shown in the figure. Also, among the p-type electrode structure constituting the p-electrode, the first metal layer and the conductive layer have the same shape as the mesa part but slightly smaller. That is, the area of the p-electrode is included in the area of the mesa part, thus it is not shown in the figure.

As shown in type "A", when the mesa edge having an acute angle protrudes out to the n-electrode forming area, the area of the mesa part in the reference circle is small, and the area of the n-electrode is large. That is, the evaluation parameter becomes large; hence the current easily concentrates at the p-electrode and the active layer of this part.

As shown in type "B", in case the mesa edge is perpendicular, the area of the mesa part in the reference circle is smaller than the area of the n-electrode. That is, the evaluation parameter is smaller than type "A", but the area of n-electrode is too large, and the current easily concentrates at the p-electrode and the active layer of this part.

As shown in type "C", in case the mesa structure is narrow, the area of the mesa part in the reference circle is smaller than the area of the n-electrode. That is, the area of n-electrode is too large, and a current easily concentrates at the p-electrode and the active layer of this part.

As shown in type "D", in case the mesa structure shows a convex arc shape towards the n-electrode side, the area of the mesa part in the reference circle is smaller than the area of the n-electrode. That is, the area of n-electrode is too large, and a current easily concentrates at the p-electrode and the active layer of this part.

As shown in type "E", in case the outline of the mesa structure is a straight line, the area of the mesa part in the reference circle is about the same as the area of the n-electrode. That is, the evaluation parameter is about 100%. The current concentration barely occurs at the p-electrode and the active layer of this part.

As shown in type "F", in case the mesa structure surrounds the n-electrode, the area of the mesa part in the reference circle is larger than the area of the n-electrode. That is, the evaluation parameter is less than 100%. The current concentration at the p-electrode and the active layer of this part barely occurs, even less than in case of the type "E".

As shown in type "G", in case the n-electrode forming area shows the convex arc shape towards the mesa structure side, then the area of the mesa structure in the reference circle is larger than the area of the n-electrode. That is, the evaluation parameter is less than 100%. The current concentration barely occurs at the p-electrode and the active layer of this part.

As clear from the above, in the preferable embodiment of the present invention, when providing the second metal layer restricted area at least to the projection part of the mesa edge, the second metal layer restricted area is the area near the mesa edge such as in types A to D in which the area of the n-electrode is larger with respect to the area of the mesa part in the reference circle. That is, the area near the mesa edge having large evaluation parameter is the second metal layer restricted area.

Therefore, the preferable embodiment of the present invention in case of providing the second metal layer restricted area at least to the projection part of the mesa edge is as shown in below.

The reference circle is drawn by taking the arbitrary point on the mesa edge as the center point. In case the evaluation parameter calculated from the area of each part in the reference circle exceeds 100%, the center of said reference circle is determined to be positioned at "the projection part of the mesa edge". When it is determined to be positioned at the projection part of the mesa edge, the outer peripheral of the second metal layer 20 is provided within the range wherein the distance between the center of the circle and the outer peripheral of the second metal layer 20 is ⅓ or more of the scattering length $L_s$ (20 μm or more in terms of the absolute distance). In other words, the area less than ⅓ of the scattering length $L_s$ (less than 20 μm in terms of the absolute distance) from the center of the circle is the second electrode layer restricted area.

Figure 5A:
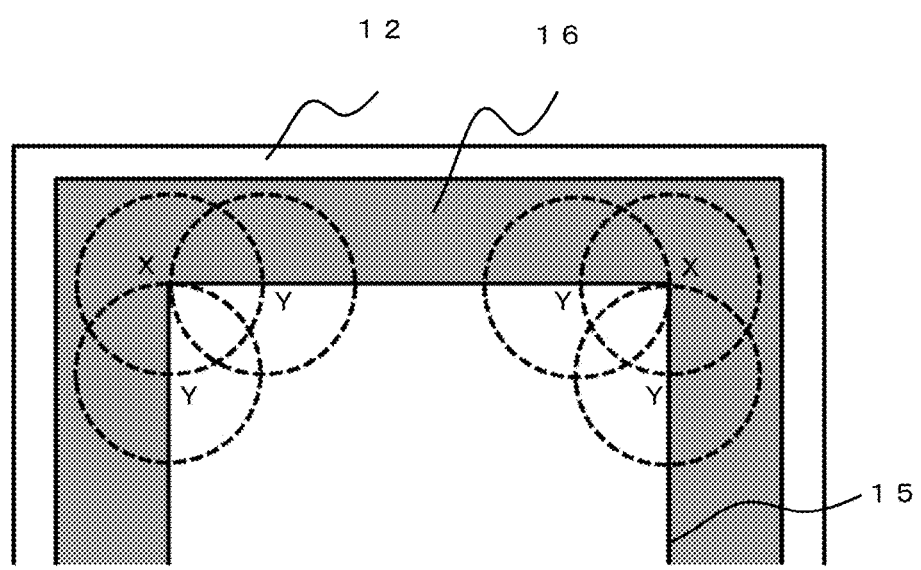
FIG. 5A shows the method of determining the second metal layer restricted area.
Figure 5B:
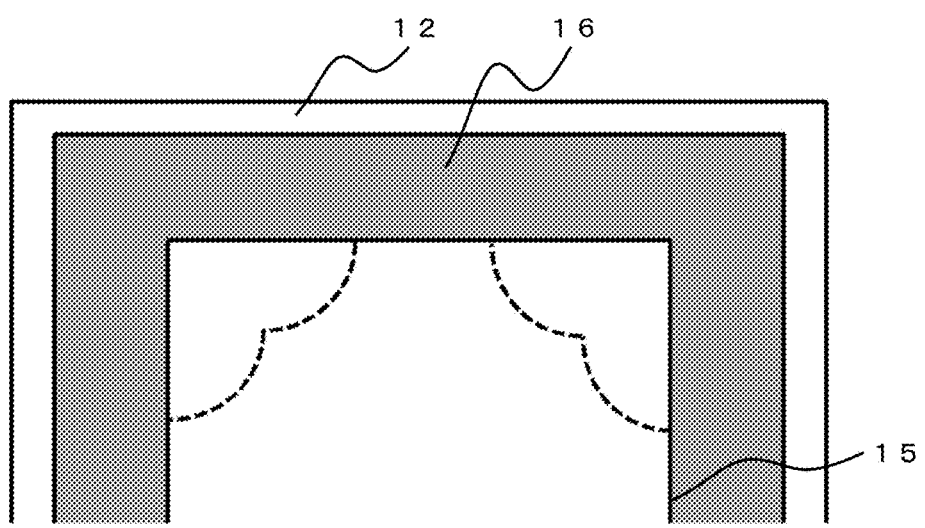
FIG. 5B shows the method of determining the second metal layer restricted area.

The above discussion will be described in further detail by referring to FIG. 5. Note that, the n-type layer and the taper part exposed between the electrodes are small in FIG. 5, thus these are not shown in the figure. For the reference circle at point "X" of FIG. 5A (the corner point of the rectangular parallelepiped shape), the evaluation parameter is about 300%. Therefore, the second metal layer is not formed within the range less than ⅓ of the scattering length $L_s$ (less than 20 μm in terms of the absolute distance) from the point "X" of the rectangular parallelepiped shape. Also, for the reference circle at the point "Y" (the mesa edge at the distance of the radius of the reference circle from the point "X") of FIG. 5A, the evaluation parameter is about 100%. Therefore, the limit of forming the second metal layer is on the circle wherein the radius from the point "Y" is ⅓ of scattering length $L_s$ (20 μm in terms of the absolute distance). Here, if the length of the radius of the reference circle is ⅓ or more of the scattering length $L_s$, then the second metal layer restricted area is the area surrounded by the broken line and the outline of the mesa part as shown in FIG. 5B. Also, the second metal layer restricted area can be formed by taking the distance of 20 μm or more from the point "X" and the point "Y".

Note that, in the preferable embodiment of the present invention, for all of the above mentioned second metal layer restricted area, the second metal layer is preferably not formed, but the second metal layer may be formed at a part of the second metal layer restricted area, as long as it does not compromise the effect of the present invention. Particularly, at the part spaced away from the mesa edge, the second metal layer may be formed in some cases. Specifically, among the second metal layer restricted area mentioned in the above, the area restricted from forming the second metal layer is preferably 90% or more, more preferably 98% or more and particularly preferably 99% or more.

In the above, the lower limit of the evaluation parameter is 100%, but the lower limit may be set accordingly depending on the material of the laminate semiconductor layer (the mesa structure part), the driving environment of the element, and the demand against the element or so.

For example, the lower limit of the acceptable evaluation parameter is set low, and the second metal layer restricted area can be widened. In this case, the evaluation parameter may be 80% or more, and it may be 60% or more. Thereby, in case the material of the element easily deteriorates and the driving environment is harsh, the current concentration to the mesa part can be securely suppressed. Note that, in this case, the average distance between the second metal layer and the n-electrode is long, thus the driving voltage of the element may increase.

Therefore, in case of further suppressing the increase of the driving voltage, the lower limit of the evaluation parameter is set high, and the second metal layer restricted area may be narrowed. In such case, the evaluation parameter may be 120% or more, and it may be 140% or more.

Note that, if the appropriate reference circle is difficult to set, then for the current product, the radius of the reference circle may be 20 μm. Also, as the electrode becomes narrower, the radius of the reference circle may become smaller; thereby the appropriate evaluation can be carried out. Note that, in this case, the circle should not contact with other mesa edge.

Figure 6:
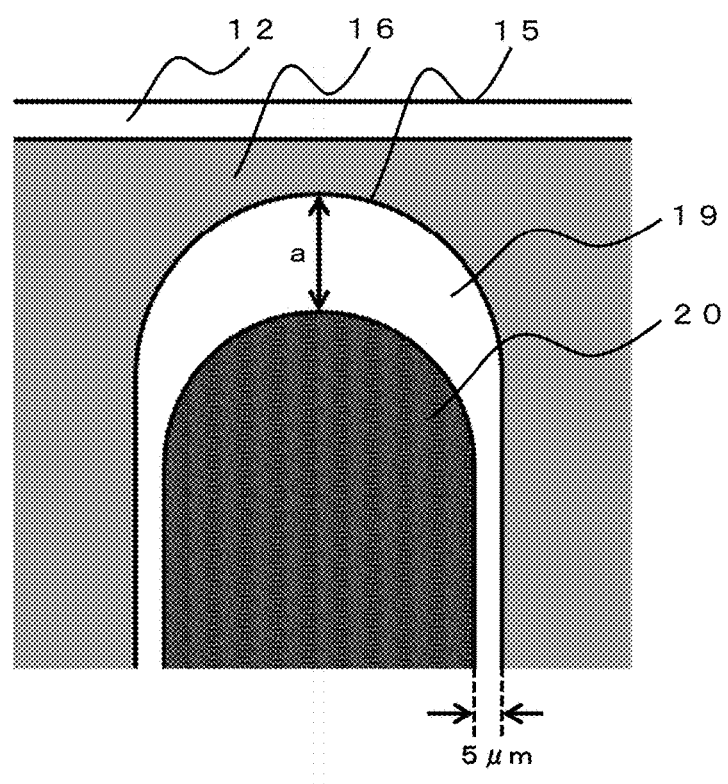
FIG. 6 shows the relationship of the position of the mesa edge and the second metal layer of the element.

In the preferable embodiment of the present invention, the conductive layer and the first metal layer of the p-type electrode structure constituting the p-electrode are formed to the entire face of the mesa part, and for the formation of the second metal layer, the second metal layer restricted area is provided within the predetermined range from "the projection part of the mesa edge". The second metal layer can be formed to the mesa part other than the second metal layer restricted area (hereinafter it may be referred as "the second metal layer allowed area"), but the second metal layer does not necessarily have to be formed to the entire second metal layer allowed area. The second metal layer only needs to be formed so that it can conduct to at least part of the second metal layer allowed area. The outer shape of the second metal layer formed near the projection part of the mesa edge may be a rectangular parallelepiped shape, and an arc shape as shown in FIG. 6, an oval arc shape and a parabolic shape or so.

Also, from the point of the art for forming the second metal layer, it is difficult to form the second metal layer so that the mesa edge and the edge part of the second metal layer matches, thus a space may be provided in a width less than ⅓ of the scattering length $L_s$, or less than 20 μm between the edge part of the second metal layer and the mesa edge. Note that, FIG. 6 shows an example provided with the space having the width of 5 μm.

Further, for the preferable embodiment of the present invention, the second metal layer may not be provided within the predetermined range from "the projection part of the mesa edge" wherein the evaluation parameter becomes certain value or more, but the evaluation parameter showing the degree of the projection of the mesa part as discussed in above continuously changes due to the shape of the mesa edge. Therefore, depending on the degree of the projection of the mesa part, the distance from the mesa edge to the second metal layer may be determined. In FIG. 5A, the evaluation parameter at the point "X" is high (the mesa part is highly projected out), thus the second metal layer may be prohibited from forming near this area (for example within 20 μm). However, the evaluation parameter of the point "Y" is low, and the current concentration barely occurs, thus the distance between the point "Y" and the second electrode layer may be less than ⅓ of the scattering length $L_s$ or less than 20 μm.

That is, at the mesa edge having high degree of projection towards the n-electrode forming area, a sufficient distance is taken between the mesa edge and the second metal layer; and for the mesa edge having low degree of projection, the distance between the second metal layer and the mesa edge can be short. For example, at the arbitrary point on the mesa edge, the evaluation parameter is determined, and based on the result thereof, "the degree of the projection" is evaluated, and thereby the width of the second metal layer restricted area from said mesa edge may be determined.

That is, at the mesa edge having high evaluation parameter, the second metal layer restricted area is larger; and at the mesa edge having low evaluation parameter, the second metal layer regulated area may be smaller than the above mentioned definition. Therefore, it may be effective to define the second metal layer restricted area using the absolute value or squared value of the evaluated parameter.

Figure 7A:
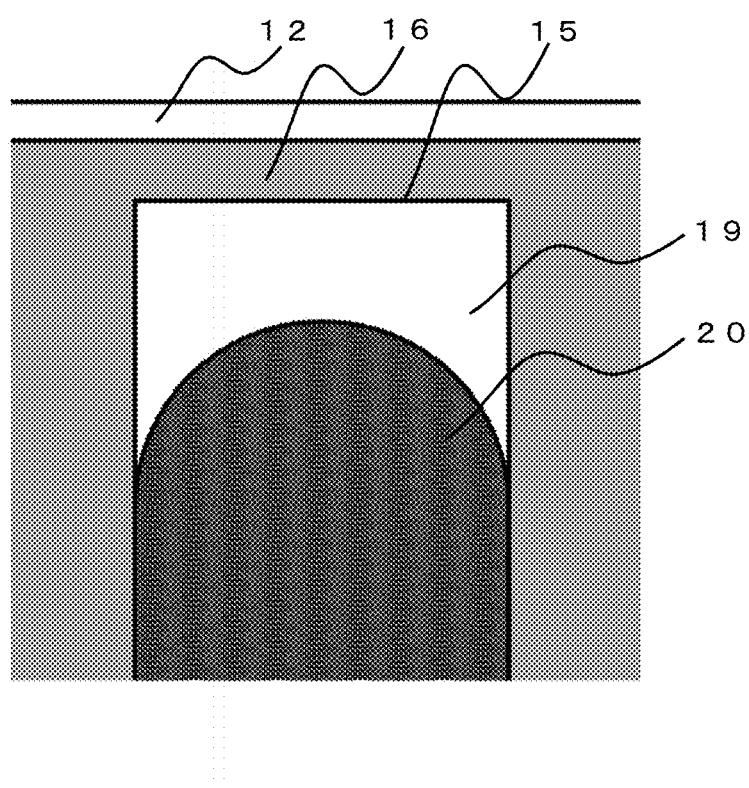
FIG. 7A shows the example of the relationship between the mesa edge and the second metal layer.

In case the mesa edge is the edge part of the rectangular parallelepiped shape as shown in FIG. 7A, the distance from the corner point of the rectangular parallelepiped shape to the second metal layer is long in the longitudinal direction, thus the second metal layer can be provided so that the distance from the middle point in the short direction of the rectangular parallelepiped shape to the second metal layer is short. The distance with the second metal layer continuously changes such that it is long from the corner point in the longitudinal direction, and short from the middle point; and as approaching the middle point, the change in the distance becomes moderate. In the longitudinal direction, the mesa edge and the second metal layer edge part may match at the end.

Figure 7B:
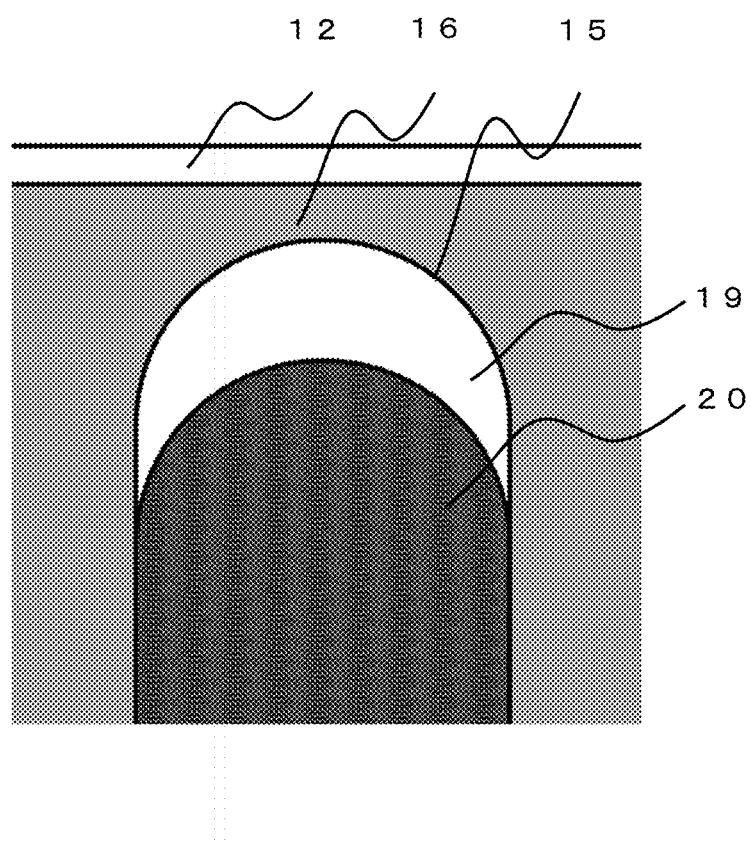
FIG. 7B shows the example of the relationship between the mesa edge and the second metal layer.

In case the mesa edge is an arc or oval arc shape as shown in FIG. 7B, the distance from the top of the arc (oval arc) to the second metal layer in the short direction is long. As the arc (oval arc) of the mesa edge turns to a straight line along the longitudinal direction, the second metal layer can be provided so that the distance between the mesa edge and the second metal layer becomes shorter. The distance with the second metal layer is long from the top of the arc shaped mesa edge, and short from the both end of the arc; thus the distance continuously changes, and as approaching to both ends, the change in the distance becomes moderate. In the longitudinal direction, the mesa edge and the second metal layer edge part may match at the end.

<Production Method of the Semiconductor Element>

After producing the wafer including the constitution of the above mentioned group III nitride semiconductor element, the lower face of the translucent substrate 11 is ground or polished, thereby the translucent substrate is made thin and the transmission factor can be improved. Then, the semiconductor element is produced using the known separation method of the semiconductor element such as scribing, dicing and laser welding or so.

Note that, in the above mentioned description, for the p-electrode laminated with the first metal layer, the conductive layer and the second metal layer in this order, the example of only modifying the shape of the second metal layer has been shown but obviously in order to improve the performance, the semiconductor element of the present invention may be combined with the conventional art.

EXAMPLE

Next, the present invention will be described in further detail by referring to the examples; however the present invention is not to be limited thereto.

Examples 1

The laminate semiconductor layer having the cross section structure shown in FIG. 1 was formed.

First, using MOCVD method, $Al_{0.7}Ga_{0.3}N$ layer (the thickness of 1 μm) doped with $1.0 \times 10^{19}$ [$cm^{-3}$] of Si was formed as the n-type semiconductor layer on the C-plane AlN substrate (the square having 7 mm on one side, the thickness of 500 μm). The active layer having the quantum well structure (the quantum well layer having the thickness of 2 nm, and the barrier layer having the thickness of 7 nm) was formed on this n-type layer. Here, the compositions of the quantum well layer and the barrier layer were $Al_{0.5}Ga_{0.5}N$ and $Al_{0.7}Ga_{0.3}N$ respectively, and $1.0 \times 10^{18}$ [$cm^{-3}$] of Si was doped to the barrier layer. The active layer constitutes from the laminate structure comprising three layers of the quantum well layers and four layers of the barrier layers.

Next, on this active layer, AlN layer (the thickness of 15 nm) doped with $5 \times 10^{19}$ [$cm^{-3}$] of Mg was formed as the electron block layer. Then, on the electron block layer, $Al_{0.8}Ga_{0.2}N$ layer (the thickness of 50 nm) doped with $5\times10^{19}$ [cm$^{-3}$] of Mg was formed as the p-clad layer. Lastly, on the p-clad layer, GaN layer (the thickness of 100 nm) doped with $2\times10^{19}$ [cm$^{-3}$] of Mg was formed as the p-contact layer.

Next, the obtained semiconductor wafer was heat treated in $N_2$ atmosphere for 20 minutes at 900° C. Then, after forming a predetermined metal mask pattern on the surface of the p-contact layer by a photolithography and a vacuum evaporation, the dry etching was carried out to the p-contact layer surface which is not formed with the pattern until the n-type layer was exposed, thereby a cross shaped mesa structure having a round end part as shown in FIG. 2C was formed.

Next, a resist pattern was formed on the p-contact layer by photolithography, then Ti (the thickness of 20 nm)/Al (the thickness of 200 nm)/Au (the thickness of 5 nm) layer was formed by vacuum evaporation to the n-type layer surface which was etched but not formed with the resist pattern, then the resist was released and a heat treatment was carried out for 1 minute at 810° C. in $N_2$ atmosphere, thereby the n-electrode was formed.

Similarly, Ni (the thickness of 20 nm)/Au (the thickness of 50 nm) layer was formed as the first metal layer on the p-contact layer, and heat treated at 550° C. for 3 minutes under the oxygen atmosphere, thereby the first metal layer was made.

Figure 9A:
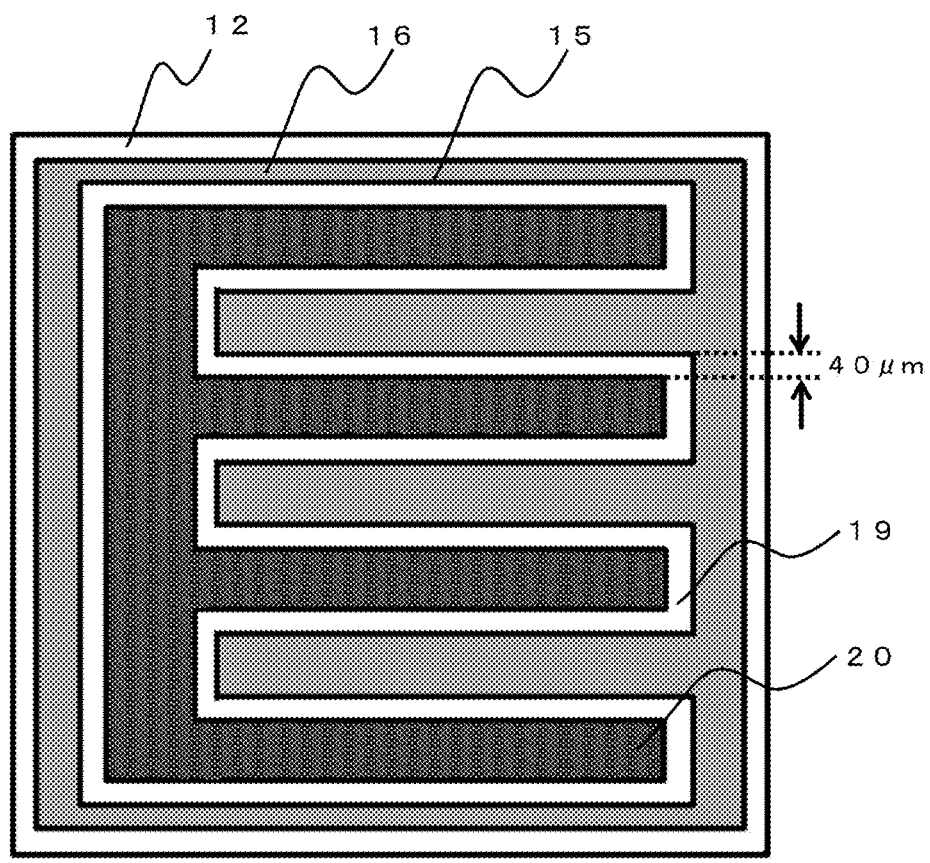
FIG. 9A shows the group III nitride semiconductor luminescence element viewing from the top according to the examples 1 to 3.

Further, Ti layer (the thickness of 500 nm) as the conductive layer was formed on the first metal layer, then Ti (the thickness of 20 nm)/Ni (the thickness of 400 nm)/Au (the thickness of 135 nm) layer as the second metal layer was laminated on Ti layer as the conductive layer. As shown in FIG. 9A, for all of the mesa edges, the distance between the mesa edge and the outer peripheral of the second metal layer was made to 40 μm.

The obtained semiconductor wafer was cut out in a square having 750 μm on one side; thereby the nitride semiconductor luminescence element was made. The specific resistance of Ti layer as the conductive layer was $0.5\times10^{-4}$ Ωcm, and the specific value of the first metal layer was $1.0\times10^{-5}$ Ωcm. The obtained group III nitride semiconductor luminescence element evenly emitted a light when the current was passed, and the luminescence wavelength was 265 nm when the current of 150 mA was passed.

Example 2

The same procedure as the example 1 was carried out except for using ITO layer instead of Ti layer of the example 1 as the conductive layer; thereby the group III nitride semiconductor luminescence element was produced. Here, the specific resistance of ITO layer as the conductive layer was $4.0\times10^{-4}$ Ωcm, and the specific resistance of the first metal layer was $1.0\times10^{-5}$ Ωcm. Also, the obtained group III nitride semiconductor luminescence element evenly emitted a light when the current was passed, and the luminescence wavelength was 265 nm when the current of 150 mA was passed.

Example 3

The same procedure as the example 1 was carried out except for using AZO layer instead of Ti layer of the example 1 as the conductive layer; thereby the group III nitride semiconductor luminescence element was produced. Here, the specific resistance of AZO layer as the conductive layer was $2.3\times10^{-4}$ Ωcm, and the specific resistance of the first metal layer was $1.0\times10^{-5}$ Ωcm. Also, the obtained group III nitride semiconductor luminescence element evenly emitted a light when the current was passed, and the luminescence wavelength was 265 nm when the current of 150 mA was passed.

Example 4

Figure 9B:
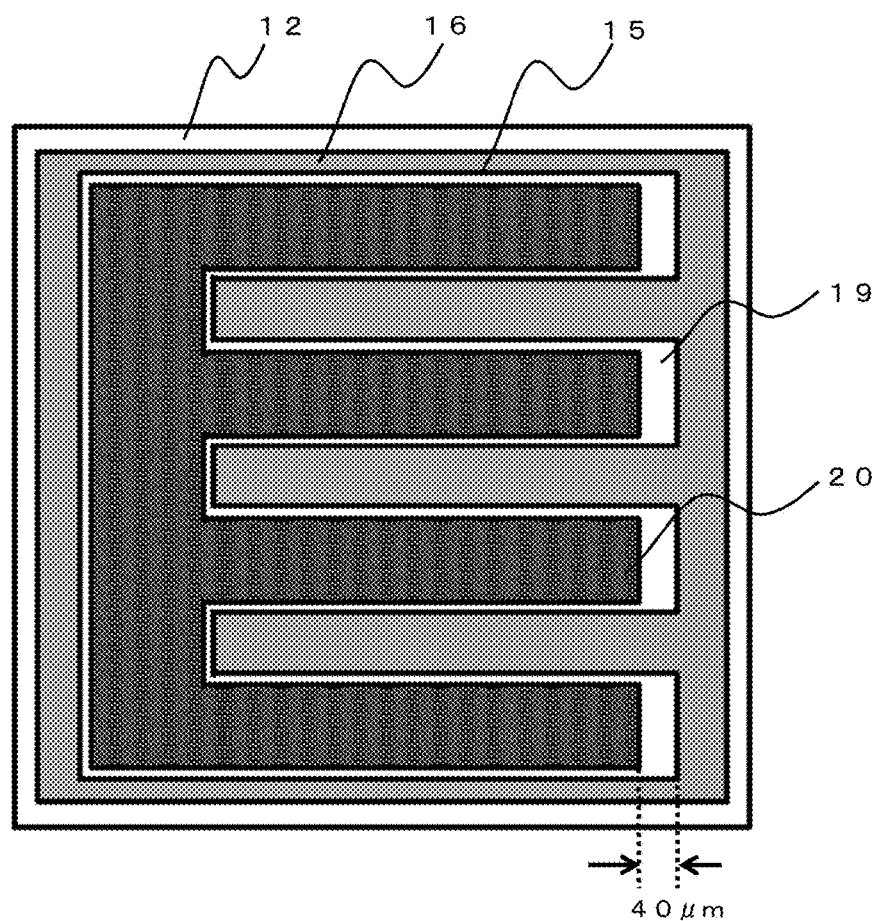
FIG. 9B shows the group III nitride semiconductor luminescence element viewing from the top according to the example 4.

The same procedure as the example 3 was carried out except that the distance between the mesa edge and the outer peripheral of the second metal layer was 40 μm only for the part where the mesa edge was projecting out, and for other parts the distance between the mesa edge and the outer peripheral of the second metal layer was 20 μm as shown in FIG. 9B; thereby the group III nitride semiconductor luminescence element was produced. The specific resistance of AZO layer as the conductive layer was $2.3\times10^{-4}$ Ωcm, and the specific resistance of the first metal layer was $1.0\times10^{-5}$ Ωcm. Also, the obtained group III nitride semiconductor luminescence element evenly emitted a light when the current was passed, and the luminescence wavelength was 265 nm when the current of 150 mA was passed.

Comparative Example 1

The group III nitride semiconductor luminescence element was produced as same as the example 1 except that the conductive layer was not provided, and the second metal layer was directly formed on the first metal layer. The obtained group III nitride semiconductor luminescence element emitted a light strongly near the mesa edge when the current was passed, but for other parts, the luminescence was weak and uneven luminescence was observed.

(Optical Output Measurement Evaluation of the Group III Nitride Semiconductor Luminescence Element)

The the optical output of the group III nitride semiconductor luminescence elements obtained by the above mentioned examples 1 to 4, and the comparative example 1 were evaluated by an integrating sphere. All of the optical output measurement evaluations were carried out by passing 150 mA current. The results are shown in Table 1. Note that, in Table 1, the luminescence efficiency of the group III nitride semiconductor luminescence element produced by the comparative example 1 was defined as 1, and the luminescence efficiency of other semiconductor luminescence elements were shown in ratio with respect to the comparative example 1 (the luminescence efficiency of the element of the examples 1 to 3/the luminesce efficiency of the comparative example 1).

TABLE 1

| | Material of conductive layer | Thickness of conductive layer [nm] | Distance from mesa edge [μm] | Luminescence efficiency ratio |
|---|---|---|---|---|
| Comparative example 1 | NONE | — | 40 | 1 |
| Example 1 | Ti | 500 | 40 | 1.01 |
| Example 2 | ITO | 500 | 40 | 1.02 |
| Example 3 | AZO | 500 | 40 | 1.10 |
| Example 4 | AZO | 500 | 40 * only the projection part | 1.02 |

REFERENCES OF NUMERICAL S

11 . . . Substrate
12 . . . n-type layer

13 . . . Active layer
14 . . . p-type layer
15 . . . Mesa structure
16 . . . n-electrode
17 . . . p-electrode
18 . . . First metal layer
19 . . . Conductive layer
20 . . . Second metal layer
30 . . . p-type electrode structure
40 . . . Group III nitride semiconductor (luminescence) element of the present invention
41 . . . Conventional group III nitride semiconductor (luminescence) element

The invention claimed is:

1. A group III nitride semiconductor element having a mesa structure comprising a n-type layer, a p-type layer, and an active layer provided between the n-type layer and the p-type layer, wherein
a n-electrode is provided on said n-type layer,
a p-electrode comprises a first metal layer, a conductive layer and a second metal layer in this order on said p-type layer,
the first metal layer is formed to the entire face of the laminate face of the p-type layer, the conductive layer is formed to the entire face of the laminate face of the first metal layer,
from the top view of said group III nitride semiconductor element, a distance between an edge of the mesa structure and an outer peripheral of the second metal layer is ⅓ or more of a scattering length Ls, and
a specific resistance of said conductive layer is higher than the specific resistance of said first metal layer.

2. The group III nitride semiconductor element as set forth in claim 1, wherein a thickness of said conductive layer is 0.05 μm or more and 20 μm or less, and the specific resistance of the conductive layer is $0.1 \times 10^{-4}$ to $1.0 \times 10^{-2}$ Ωcm.

3. The group III nitride semiconductor element as set forth in claim 1, wherein said first metal layer is a layer ohmically contacting with said p-type layer, and said first metal layer is constituted from single metal or two or more metals.

4. The group III nitride semiconductor as set forth in claim 1, wherein from the top view of said group III nitride semiconductor element, a distance between the edge of the mesa structure and the outer peripheral of said second metal layer is 20 μm or more.

5. The group III nitride semiconductor element as set forth in claim 1, wherein from the top view of said group III nitride semiconductor element, a distance between at least the projection part of the edge of the mesa structure and the outer peripheral of said second metal layer is 20 μm or more.

6. The group III nitride semiconductor luminescence element as set forth in claim 1, wherein a luminescence peak wavelength is 200 to 350 nm.

7. A wafer comprising:
the group III nitride semiconductor element of claim 1.

8. A wafer comprising:
the group III nitride semiconductor luminescence element of claim 6.

9. The group III nitride semiconductor as set forth in claim 1, wherein the second metal layer is formed only to a part of the face of the laminate face of the conductive layer.

* * * * *